US009704954B2

(12) United States Patent
Tutuc et al.

(10) Patent No.: US 9,704,954 B2
(45) Date of Patent: Jul. 11, 2017

(54) SEMICONDUCTOR DEVICE AND A METHOD FOR FORMING A SEMICONDUCTOR DEVICE

(71) Applicant: Infineon Technologies Austria AG, Villach (AT)

(72) Inventors: Daniel Tutuc, St. Niklas an der Drau (AT); Franz Hirler, Isen (DE); Andreas Voerckel, Finkenstein (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/041,671

(22) Filed: Feb. 11, 2016

(65) Prior Publication Data

US 2016/0240615 A1 Aug. 18, 2016

(30) Foreign Application Priority Data

Feb. 13, 2015 (DE) .................. 10 2015 102 136

(51) Int. Cl.
*H01L 29/06* (2006.01)
*H01L 29/78* (2006.01)
(Continued)

(52) U.S. Cl.
CPC ...... *H01L 29/0696* (2013.01); *H01L 29/0634* (2013.01); *H01L 29/1095* (2013.01);
(Continued)

(58) Field of Classification Search
CPC ............... H01L 29/0696; H01L 29/402; H01L 29/7823; H01L 29/66681; H01L 29/7393; H01L 29/1095; H01L 29/66325
(Continued)

(56) References Cited

U.S. PATENT DOCUMENTS

2011/0220992 A1   9/2011  Inomata
2015/0187930 A1*  7/2015  Onishi .................. H01L 29/063
                                                                   257/328

FOREIGN PATENT DOCUMENTS

DE        10106006 A1    8/2001
EP         1111685 A1    6/2001

OTHER PUBLICATIONS

Office Action Communication of the German Patent and Trademark Office re: File Reference 10 2015 102 136.6, Aug. 20, 2015.

* cited by examiner

*Primary Examiner* — Caleen Sullivan
(74) *Attorney, Agent, or Firm* — Baker Botts L.L.P.

(57) ABSTRACT

A semiconductor device comprises at least one strip-shaped cell compensation region of a vertical electrical element arrangement, at least one strip-shaped edge compensation region and a bridge structure. The at least one strip-shaped cell compensation regions extends into a semiconductor substrate and comprises a first conductivity type. Further, the at least one strip-shaped cell compensation region is connected to a first electrode structure of the vertical electrical element arrangement. The at least one strip-shaped edge compensation region extends into the semiconductor substrate within an edge termination region of the semiconductor device and outside the cell region. Further, the at least one strip-shaped edge compensation region comprises the first conductivity type. The bridge structure electrically connects the at least one strip-shaped edge compensation region with the at least one strip-shaped cell compensation region within the edge termination region.

19 Claims, 19 Drawing Sheets

(51) Int. Cl.
    *H01L 29/40*         (2006.01)
    *H01L 29/10*         (2006.01)
    *H01L 29/739*       (2006.01)
    *H01L 29/66*         (2006.01)
    *H01L 29/16*         (2006.01)
    *H01L 29/20*         (2006.01)

(52) U.S. Cl.
    CPC ...... *H01L 29/402* (2013.01); *H01L 29/66325* (2013.01); *H01L 29/66681* (2013.01); *H01L 29/7393* (2013.01); *H01L 29/7823* (2013.01); H01L 29/0692 (2013.01); H01L 29/1608 (2013.01); H01L 29/20 (2013.01); H01L 29/2003 (2013.01)

(58) Field of Classification Search
    USPC .......................................................... 257/141
    See application file for complete search history.

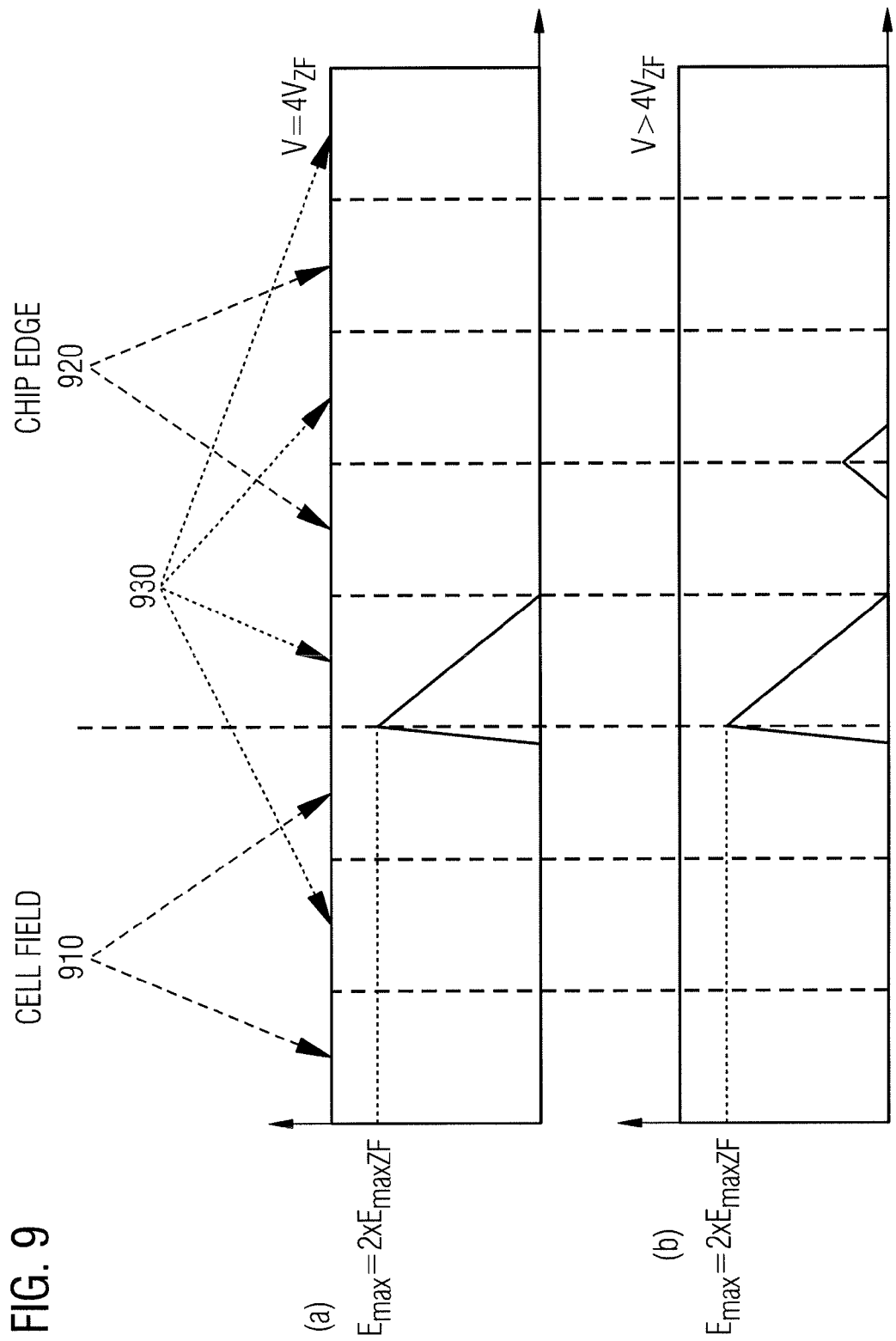

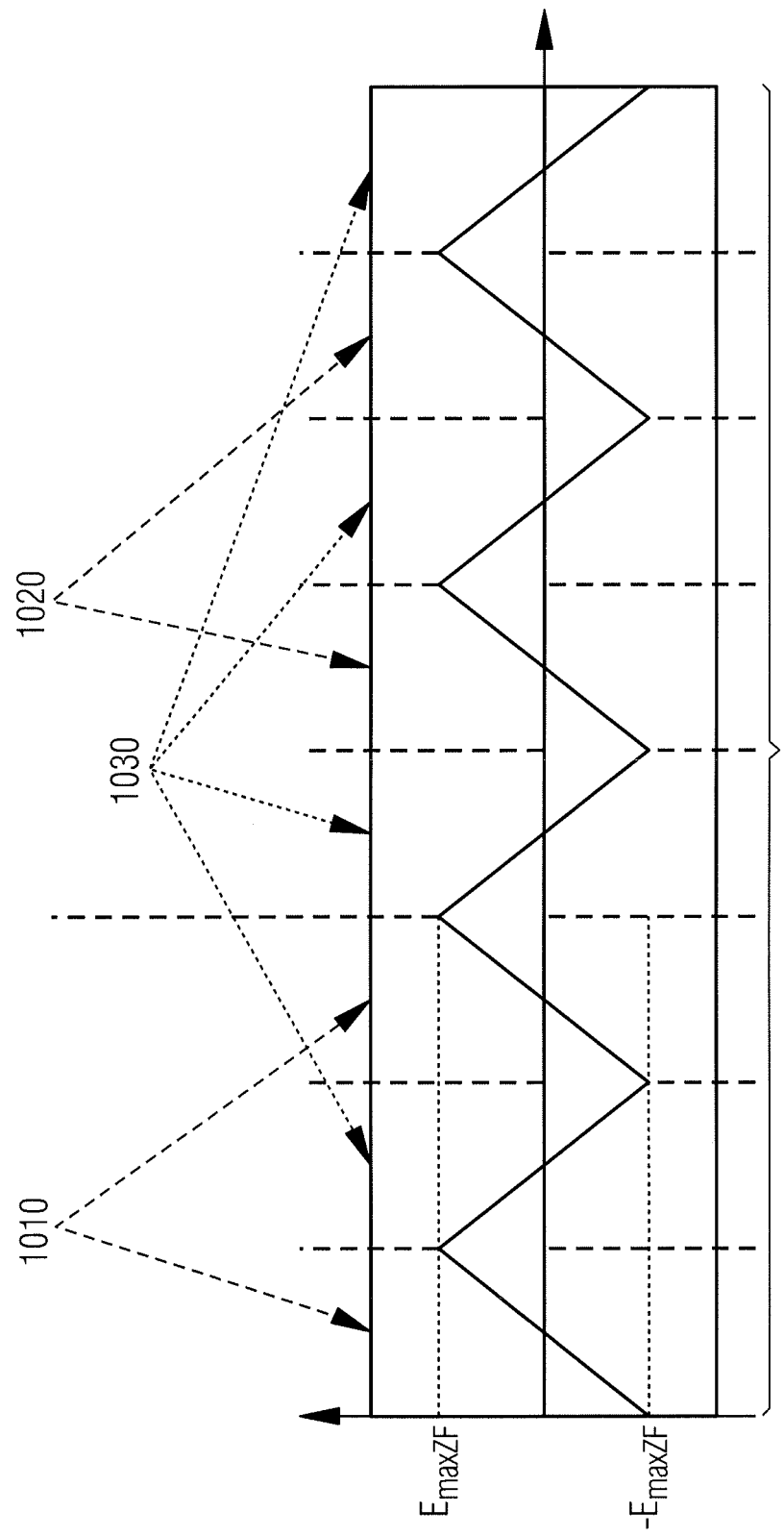

SEMICONDUCTOR DEVICE AND A METHOD FOR FORMING A SEMICONDUCTOR DEVICE

CROSS-REFERENCE TO RELATED APPLICATION

This application claims priority to German Application Serial No. 102015102136.6 filed Feb. 13, 2015 and entitled "A Semiconductor Device and a Method for Forming a Semiconductor Device".

TECHNICAL FIELD

Embodiments relate to chip edge concepts of semiconductor devices and in particular to a semiconductor device and a method for forming a semiconductor device.

BACKGROUND

Several semiconductor devices are based on compensation structures. Such compensation devices are n- or p-channel metal oxide semiconductor field-effect transistors, diodes, thyristors or other components. Compensation devices may be based on mutual compensation of a charge of n- and p-doped areas in the drift region of the transistor. The areas are spatially arranged such that the line integral over the doping along a line running vertical to the p-n-junction remains below the material-specific breakdown voltage (approximately $2 \times 10^{12}$ cm$^{-2}$ for silicon). For example, in a vertical transistor, p- and n-pillars or plates may be arranged in pairs.

By means of the extensive compensation of the p- and n-doping, the doping of the current carrying region (for an n-channel transistor, the n-region and for a p-channel transistor, the p-region) may be significantly increased. Despite the loss in current-carrying area, a clear gain in on-resistance may result. The blocking capability and the switching losses of the semiconductor device may depend on various parameters. It may be desired to improve the blocking capability and/or reduce the switching losses of semiconductor devices.

SUMMARY

Some embodiments relate to a semiconductor device comprising at least one strip-shaped cell compensation region of a vertical electrical element arrangement, at least one strip-shaped edge compensation region and a bridge structure. The at least one strip-shaped cell compensation region extends into a semiconductor substrate and comprises a first conductivity type. Further, the at least one strip-shaped cell compensation region is connected to a first electrode structure of the vertical electrical element arrangement. The at least one strip-shaped edge compensation region extends into the semiconductor substrate within an edge termination region of the semiconductor device outside the cell region. Further, the at least one strip-shaped edge compensation region comprises the first conductivity type. The bridge structure electrically connects the at least one strip-shaped edge compensation region with the at least one strip-shaped cell compensation region within the edge termination region.

Some embodiments relate to a semiconductor device comprising a plurality of strip-shaped cell compensation regions of a vertical electrical element arrangement of a first conductivity type arranged adjacent to a plurality of strip-shaped drift regions of the vertical electrical element arrangement of a second conductivity type. Further, the semiconductor device comprises a plurality of strip-shaped edge compensation regions of the first conductivity type arranged adjacent to inactive strip-shaped regions of the second conductivity type. Additionally, the semiconductor device comprises a bridge structure electrically connecting the plurality of strip-shaped edge compensation regions with at least one strip-shaped cell compensation region of the plurality of strip-shaped cell compensation regions.

Some embodiments relate to a method for forming a semiconductor device comprising forming at least one strip-shaped cell compensation region of a vertical electrical element arrangement. The at least one strip-shaped cell compensation region extends into a semiconductor substrate and comprises a first conductivity type. Further, the at least one strip-shaped cell compensation region is connected to a first electrode structure of the vertical electrical element arrangement. Additionally, the method comprises forming at least one strip-shaped edge compensation region extending into the semiconductor substrate within an edge termination region of the semiconductor device and outside a cell region. The at least one strip-shaped edge compensation region comprises the first conductivity type. Further, the method comprises forming a bridge structure electrically connecting the at least one strip-shaped edge compensation region with the at least one strip-shaped cell compensation region within the edge termination region. Additionally, the method comprises forming the first electrode structure in contact with the semiconductor substrate within the cell region of the semiconductor device only.

BRIEF DESCRIPTION OF THE FIGURES

Some embodiments of apparatuses and/or methods will be described in the following by way of example only, and with reference to the accompanying figures, in which

FIGS. 9A and 9B show a schematic illustration of the electric field at the border between the cell field and the chip edge of a semiconductor device comprising floating compensation structures within the chip edge region for two different applied voltages;

FIG. 10 shows a schematic illustration of the electric field within a semiconductor device at a border between the cell field and the chip edge of the semiconductor device comprising compensation regions within the chip edge connected through a bridge structure to compensation regions within the cell field;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
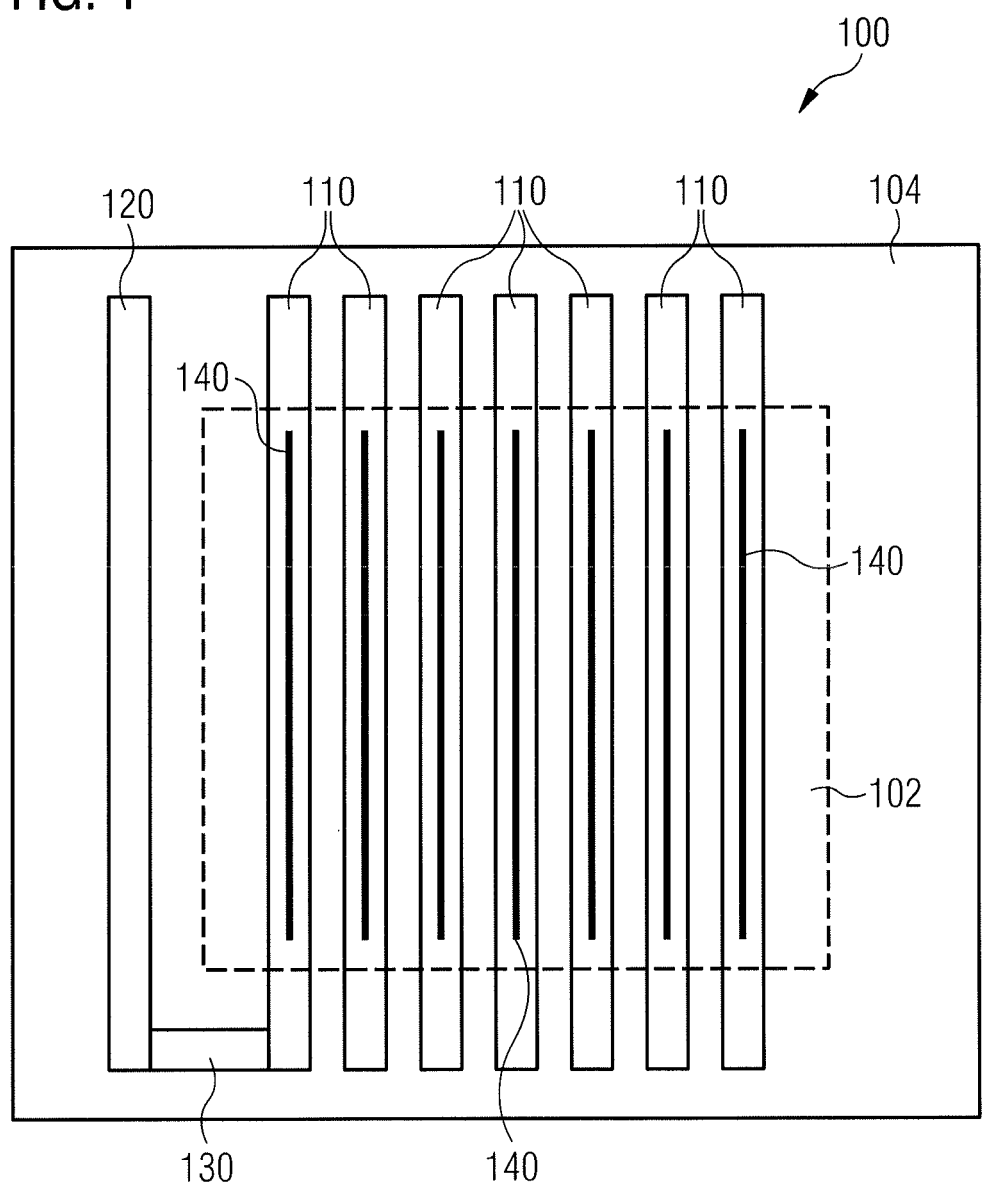
FIG. 1 shows a schematic top view of a semiconductor device.

FIG. 1 shows a schematic top view of a semiconductor device 100 according to an embodiment. The semiconductor device 100 comprises at least one stripe-shaped cell compensation region 110 of a vertical electrical element arrangement, at least one stripe-shaped edge compensation region and at least one bridge structure 130. The at least one stripe-shaped cell compensation region 110 extends into a semiconductor substrate and comprises a first conductivity type. Further, the stripe-shaped cell compensation region 110 is connected to a first electrode structure 140 of the vertical electrical element arrangement. The at least one stripe-shaped edge compensation region 120 extends into the semiconductor substrate within an edge termination region 104 of the semiconductor device 100 and outside the cell region 102. Further, the at least one stripe-shaped edge compensation region comprises the first conductivity type. The bridge structure 130 electrically connects the at least one stripe-shaped edge compensation region 120 with the at least one stripe-shaped cell compensation region 110 within the edge termination region 104.

Free charge carriers may be removed from the at least one stripe-shaped edge compensation region during the switch-off of the vertical electrical element arrangement through the bridge structure and the at least one stripe-shaped cell compensation region to the first electrode structure due to the implementation of the bridge structure. In this way, a low-ohmic path may be provided for the depletion of charge carriers within the stripe-shaped edge compensation region during switch-off In this way, switching losses may be reduced and/or the breakthrough behavior of the semiconductor device may be improved.

The at least one stripe-shaped cell compensation region 110 may be one of a plurality of stripe-shaped cell compensation regions 110. The plurality of stripe-shaped cell compensation regions 110 may be regions of the semiconductor substrate comprising a stripe-shape in a top view of the semiconductor device 100. A stripe-shape may be a geometry extending in a first lateral direction significantly farther than in an orthogonal second lateral direction. For example, the stripe-shaped cell compensation regions 110 may comprise a lateral length of more than 10× (or more than 50× or more than 100×) a lateral width of a stripe-shaped cell compensation region 110 of the plurality of stripe-shaped cell compensation regions. The lateral length of the stripe-shaped cell compensation region 110 may be the largest extension along the front side surface of the semiconductor substrate and a lateral width of the striped-shape cell compensation region may be a shortest dimension of the stripe-shaped cell compensation region 110. The plurality of stripe-shaped cell compensation regions may all comprise the same lateral length and/or the same lateral width. Alternatively, the lateral length and/or the lateral width of the plurality of stripe-shaped cell compensation regions 110 may differ at least partly from each other.

Further, the plurality of stripe-shaped cell compensation regions 110 comprise a vertical extension (e.g. vertical depth). In other words, the stripe-shaped cell compensation regions 110 may be laminar structures or may comprise the geometry of a wall or plate. The vertical extension may be larger than the lateral width and shorter than the lateral length. For example, the plurality of stripe-shaped cell compensation regions 110 extend from a front side surface of the semiconductor substrate into a depth of more than 10 µm (or more than 20 µm or more than 50 µm).

The stripe-shaped cell compensation regions 110 of the plurality of stripe-shaped cell compensation regions may be arranged substantially in parallel to each other (e.g. neglecting manufacturing tolerances).

In a cross-section orthogonal to the lateral length of the stripe-shaped cell compensation structures 110, the stripe-shaped cell compensation regions may comprise a pillar shape. The plurality of stripe-shaped cell compensation regions 110 may be arranged alternating to a plurality of stripe-shaped drift regions of the vertical electrical element arrangement. In other words, a stripe-shaped drift region of the vertical electrical element arrangement may extend into the semiconductor substrate between each two stripe-shaped cell compensation regions 110 within the cell region 102 of the semiconductor device 100. The plurality of stripe-shaped drift regions may comprise a second conductivity type.

A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. In other words, the first conductivity type may indicate an p-doping and the second conductivity type may indicate a n-doping or vice-versa.

The geometry of the at least one stripe-shaped edge compensation region may correspond or may be similar to the mentioned geometry of the stripe-shaped cell compensation regions 110. The at least one stripe-shaped edge compensation region 120 may be arranged substantially in parallel to the plurality of stripe-shaped cell compensation regions 110. The at least one stripe-shaped edge compensation region 120 may comprise the same lateral length and/or lateral width and/or vertical extension as one, some or all stripe-shaped cell compensation regions 110 of the plurality of stripe-shaped cell compensation regions 110. The at least one stripe-shaped edge compensation region 120 comprises the same conductivity type as the plurality of stripe-shaped cell compensation regions. The at least one stripe-shaped edge compensation region 120 may be manufactured simultaneously with the plurality of stripe-shaped cell compensation regions 110. The semiconductor device 110 may comprise a plurality of stripe-shaped edge compensation regions arranged within the edge termination region 104 outside the cell region.

In contrast to the plurality of stripe-shaped cell compensation regions 110, the at least one stripe-shaped edge compensation region 120 is not connected to the first electrode structure directly, since the first electrode structure 140 is in contact with the semiconductor substrate within the cell region 102 of the semiconductor device 100 only. In other words, the first electrode structure 140 is implemented without a contact to the semiconductor substrate within the edge termination region 104.

A lateral direction may be in parallel to a main surface or front side surface of the semiconductor substrate and a vertical direction may be orthogonal to the main surface or front side surface of the semiconductor substrate.

The cell region 102 of the semiconductor device 100 may be located in proximity to or centered to a center region of the semiconductor device 100 laterally surrounded by the edge termination region 104. The edge termination region 104 may extend from an edge of the semiconductor substrate of the semiconductor device 100 (e.g. semiconductor die) laterally towards the cell region 102. The edge termination region 104 may comprise a lateral width measured from an edge of the semiconductor substrate towards the cell region 102 of less than 500 µm and more than 50 µm, for example.

For example, the semiconductor substrate may be part of a semiconductor wafer or a semiconductor die. The semiconductor substrate of the semiconductor device 100 may be a silicon substrate, a silicon carbide substrate, a gallium arsenide substrate or a gallium nitride substrate, for example.

The vertical electrical element arrangement may be a field-effect transistor arrangement (e.g. metal oxide semiconductor transistor or insulated gate bipolar transistor) or a diode arrangement, for example.

The first electrode structure 140 may be an electrically-conductive structure implemented on top of the semiconductor substrate. The first electrode structure 140 may be in contact with the semiconductor substrate within the cell region 102 of the semiconductor device 100 only. For example, the first electrode structure 140 may comprise vias or contacts for vertically connecting regions of the semiconductor substrate to metal layers or metal lines above the semiconductor substrate and/or vias for electrically connecting different metal layers or metal lines above or on top of the semiconductor substrate. The first electrode structure 140 may be a source electrode structure of a field-effect transistor arrangement or an anode or cathode electrode structure of a diode arrangement, for example.

The first electrode structure 140 may connect at least the plurality of stripe-shaped cell compensation regions 110 (and optionally also other regions of the cell region) to a pad or interface of the semiconductor device 100 for enabling a connection to an external electrical device.

The first electrode structure 140 may comprise an ohmic contact to the plurality of stripe-shaped cell compensation regions 110. The first electrode structure 140 may comprise a field plate being in contact with the plurality of stripe-shaped cell compensation regions 110 through contact vias in contact holes. The area of the cell region may be substantially equal to an area covered by the field plate of the first electrode structure, for example.

The plurality of stripe-shaped cell compensation regions 110 and the at least one stripe-shaped edge compensation region 120 may be formed by a multi-epitaxial/multi-implant process or by a trench process (e.g. shown in FIG. 12), for example.

The bridge structure 130 electrically connects the at least one stripe-shaped edge compensation region 120 with at least one stripe-shaped cell compensation region 110 outside the cell region 102 and within the edge termination region 104. For example, the bridge structure 130 is located within the edge termination region 104 and outside the cell region 102. The bridge structure 130 may provide an ohmic connection between the at least one stripe-shaped edge compensation region 120 and at least one stripe-shaped cell compensation region 110. Optionally, the bridge structure 130 may connect more than one stripe-shaped edge compensation region 120 to at least one stripe-shaped cell compensation region 110 and/or may connect the at least one stripe-shaped edge compensation region 120 to more than one stripe-shaped cell compensation region 110.

For example, the bridge structure 130 may be the only ohmic connection of the at least one stripe-shaped edge compensation region 120 to a structure providing a defined potential (e.g. otherwise the at least one stripe-shaped edge compensation region may be floating).

The bridge structure 130 may enable a low ohmic current path from the at least one stripe-shaped edge compensation region 120 to the first electrode structure 140. For example, the bridge structure 130 may establish a current path without p-n-junction between the at least one stripe-shaped edge compensation region 120 and the at least one stripe-shaped cell compensation region 110. For example, the bridge structure 130 may electrically connect the at least one strip-shaped edge compensation region 120 with the at least one strip-shaped cell compensation region 110 so that a number of free charge carriers within the at least one strip-shaped edge compensation region 120 is reduced by a current through the bridge structure 130 and the at least one strip-shaped cell compensation region 110 to the first electrode structure 140 during switching the vertical electrical element arrangement from an on-state to an off-state.

The bridge structure 130 may be implemented in various ways. For example, the bridge structure 130 may comprise a highly-doped doping region of the first conductivity type electrically connecting the at least one stripe-shaped edge compensation region with the at least one stripe-shaped cell compensation region 110. In other words, the bridge structure 130 may be a highly-doped semiconductor region located between the at least one stripe-shaped edge compensation region 120 and the at least one stripe-shaped cell compensation region 110 within the edge termination region 104. For example, a (average or maximal) doping concentration of the highly-doped doping region of the bridge structure 130 is larger than a doping concentration of the at least one stripe-shaped cell compensation region 110 and/or the at least one stripe-shaped edge compensation region 120. For example, the (average or maximal) doping concentration of the highly-doped doping region of the bridge structure 130 may be larger than $1 \times 10^{17}$ cm$^{-3}$ (or larger than $1 \times 10^{18}$ cm$^{-3}$ or larger than $1 \times 10^{19}$ cm$^{-3}$ or between $1 \times 10^{17}$ cm$^{-3}$ and $1 \times 10^{20}$ cm$^{-3}$).

Alternatively, the bridge structure 130 may be implemented on top of the semiconductor substrate by utilization of one or more metal layers or metal lines available in the course of manufacturing anyway. For example, the bridge structure 130 comprises a conductive material structure (e.g. comprising metal and/or polysilicon) above the semiconductor substrate (outside the semiconductor substrate) being in contact with the at least one stripe-shaped edge compensation region 120 and the at least one stripe-shaped cell compensation region 110 within the edge termination region 104. For example, the bridge structure 130 may be in contact with the at least one stripe-shaped edge compensation region 120 by a first contact via or contact plug connecting the at least one stripe-shaped edge compensation region 120 to a metal line or metal layer. Further, the bridge structure 130 may be in contact with the at least one stripe-shaped cell compensation region 110 by a second contact via or contact plug connecting the at least one stripe-shaped cell compensation region 110 to a metal line or metal layer. Furthermore, the bridge structure may comprise a metal line or metal layer connecting the first contact via or contact plug and the second contact via or contact plug.

The bridge structure 130 may be arranged at an arbitrary position within the edge termination region 104. For example, a distance between the first electrode structure and a contact area between the bridge structure 130 and the at least one strip-shaped cell compensation region 110 is larger than 50 μm (or larger than 100 μm or larger than 200 μm or larger than 500 μm). By increasing the distance between the first electrode structure 140 and the bridge structure 130, the voltage stability of the semiconductor device 100 may be increased.

For example, the at least one strip-shaped cell compensation region 110 connected to the bridge structure 130 may comprise a first part being located in the cell region 102 and being in contact with the first electrode structure 140 and a second part being located in the edge termination region 104 and being in contact with the bridge structure 130. The voltage stability of the semiconductor device 100 may be increased with increasing distance between the first portion and the second portion of the at least one strip-shaped cell compensation region 110.

For example, the bridge structure 130 may be connected to a lateral end of the at least one strip-shaped cell compensation region 110 and/or to a lateral end of the at least one strip-shaped edge compensation region 120. In other words, the bridge structure 130 may be connected to the at least one strip-shaped cell compensation region 110 at an end portion of the at least one strip-shaped cell compensation region 110. The end portion of the at least one strip-shaped cell compensation region 110 may be represented by the last 10% of length of the at least one strip-shaped cell compensation region.

The semiconductor device 100 may comprise optionally a second electrode structure (e.g. drain electrode structure, drain plate or cathode or anode electrode structure) arranged within the edge termination region at the front side of the semiconductor substrate. The second electrode structure may be electrically connected to a back side electrode structure or a drain or emitter region of the semiconductor substrate. For example, the first electrode structure may be a source electrode structure of a field effect transistor arrangement and the second electrode structure may be a drain electrode structure connected to a back side drain electrode of the field effect transistor arrangement. The second electrode structure may comprise a field plate (e.g. drain plate) located within the edge termination region 104 laterally surrounding the cell region 104.

For example, the bridge structure 130 may be located below (in a top view of the front side of the semiconductor device) a field plate of the second electrode structure or may be located closer to an edge of the second electrode plate of the second electrode structure than to an edge of the cell region 104. For example, the lateral end of the at least one strip-shaped cell compensation region 110 and the at least one strip-shaped edge compensation region 120 may extend laterally below the field plate of the second electrode structure and the bridge structure 130 may connect the lateral ends of the at least one strip-shaped cell compensation region 110 and the lateral end of the at least one strip-shaped edge compensation region 120. Alternatively, the bridge structure 130 may be arranged laterally between the field plate of the second electrode structure and a field plate of the first electrode structure.

For example, the bridge structure 130 may extend substantially in parallel to an edge of the field plate of the second electrode structure (the edge towards the cell region). In other words, a distance (e.g. minimal lateral distance in a top view of the semiconductor device) between the bridge structure 130 and the edge of the field plate of the second electrode structure may vary by less than 10% of the distance or by less than 20 μm along the bridge structure 130. The bridge structure 130 may establish an equipotential surface or nearly equipotential surface due to the alignment to the edge of the field plate of the second electrode structure. In this way, the blocking voltage bearable by the edge termination region may be increased and/or switching losses may be reduced.

The semiconductor device 100 may comprise a drain or emitter region within the semiconductor substrate arranged vertically between the plurality of strip-shaped cell compensation regions 120 and a back side electrode arranged at a backside surface of the semiconductor substrate. The drain or emitter region may comprise the second conductivity type.

The semiconductor device may be a compensation device. Compensation devices may be based on mutual compensation of at least a part of the charge of n- and p-doped areas in the drift region of the vertical electrical element arrangement. For example, in a vertical transistor, p-and n-pillars or plates (plurality of strip shaped drift regions and plurality of strip-shaped cell compensation regions) may be arranged in pairs. For example, a strip-shaped cell compensation region 110 of the plurality of strip-shaped cell compensation regions 110 comprises a laterally summed number of dopants per unit area of the first conductivity type (p or n) deviating from half of a laterally summed number of dopants per unit area of the second conductivity type (n or p) comprised by two strip-shaped drift regions located adjacent to opposite sides of the strip-shaped cell compensation region by less than +/−25% (or less than 15%, less than +/−10%, less than +/−5%, less than 2% or less than 1%) of the laterally summed number of dopants per unit area of the first conductivity type comprised by the strip-shaped cell compensation region. The lateral summed number of dopants per unit area may be substantially constant or may vary for different depths. The lateral summed number of dopants per unit area may be equal or proportional to a number of free charge carriers within a strip-shaped cell compensation region 110 or a strip-shaped drift region to be compensated in a particular depth, for example.

In the following, examples are described in connection with field effect transistor arrangements, although also other vertical electrical element arrangements may be implemented according tone or more of the described aspects.

Figure 2:
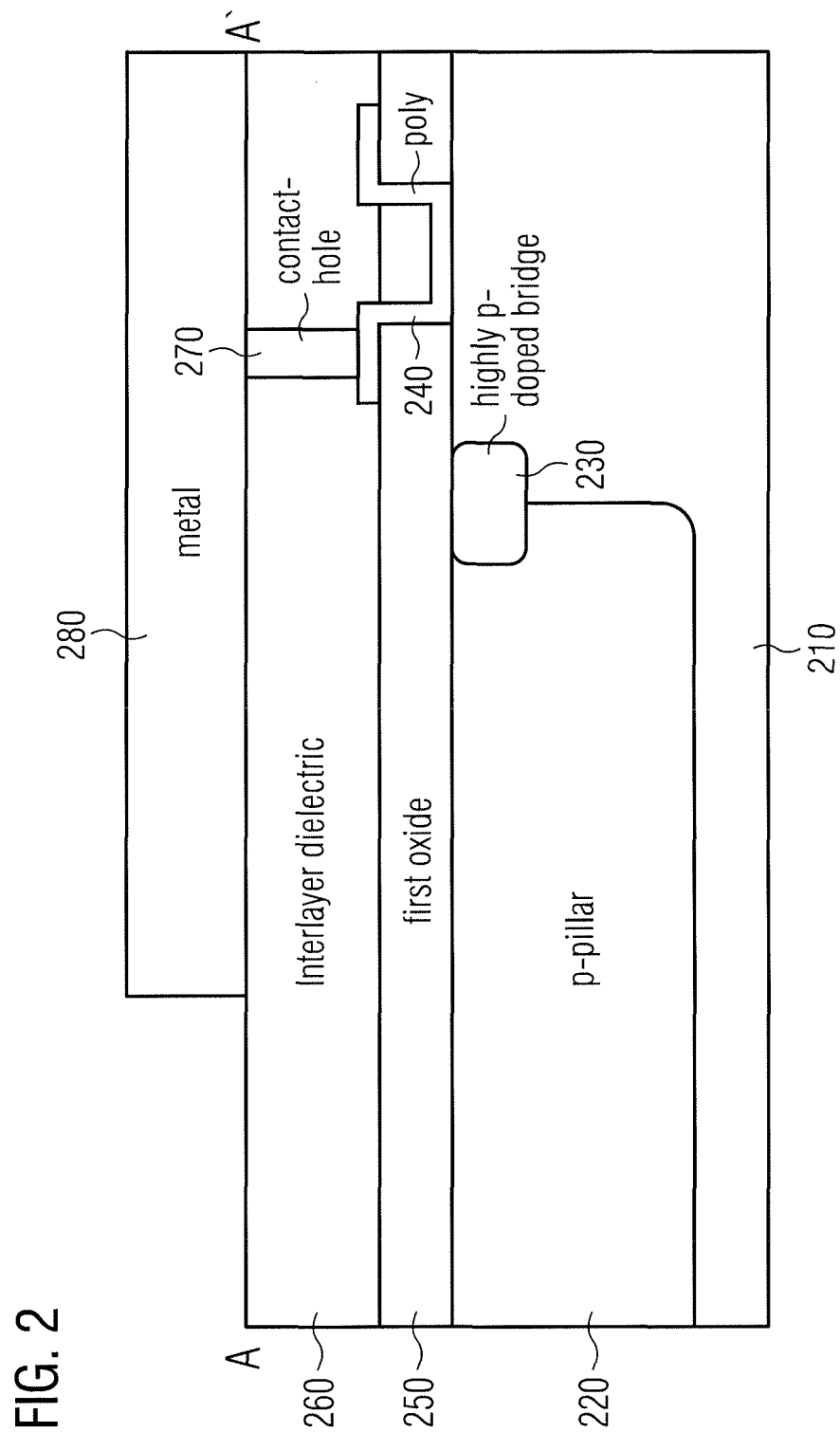
FIG. 2 shows a schematic cross-section of an edge termination region of a semiconductor device.

FIG. 2 shows a schematic cross section of a part of an edge termination region of a semiconductor device. The cross section is adjusted in parallel to the lateral length of a strip-shaped edge compensation region 220 represented by a p-doped pillar (e.g. comprising a doping concentration between $1*10^{15}$ cm$^{-3}$ and $5*10^{16}$ cm$^{-3}$, for example, $5*10^{15}$ cm$^{-3}$ or $1*10^{16}$ cm$^{-3}$) embedded in an n-doped part of the semiconductor substrate 210 (e.g. comprising a doping concentration between $1*10^{15}$ cm$^{-3}$ and $5*10^{16}$ cm$^{-3}$, for example, $5*10^{15}$ cm$^{-3}$ or $1*10^{16}$ cm$^{-3}$).

Figure 3:
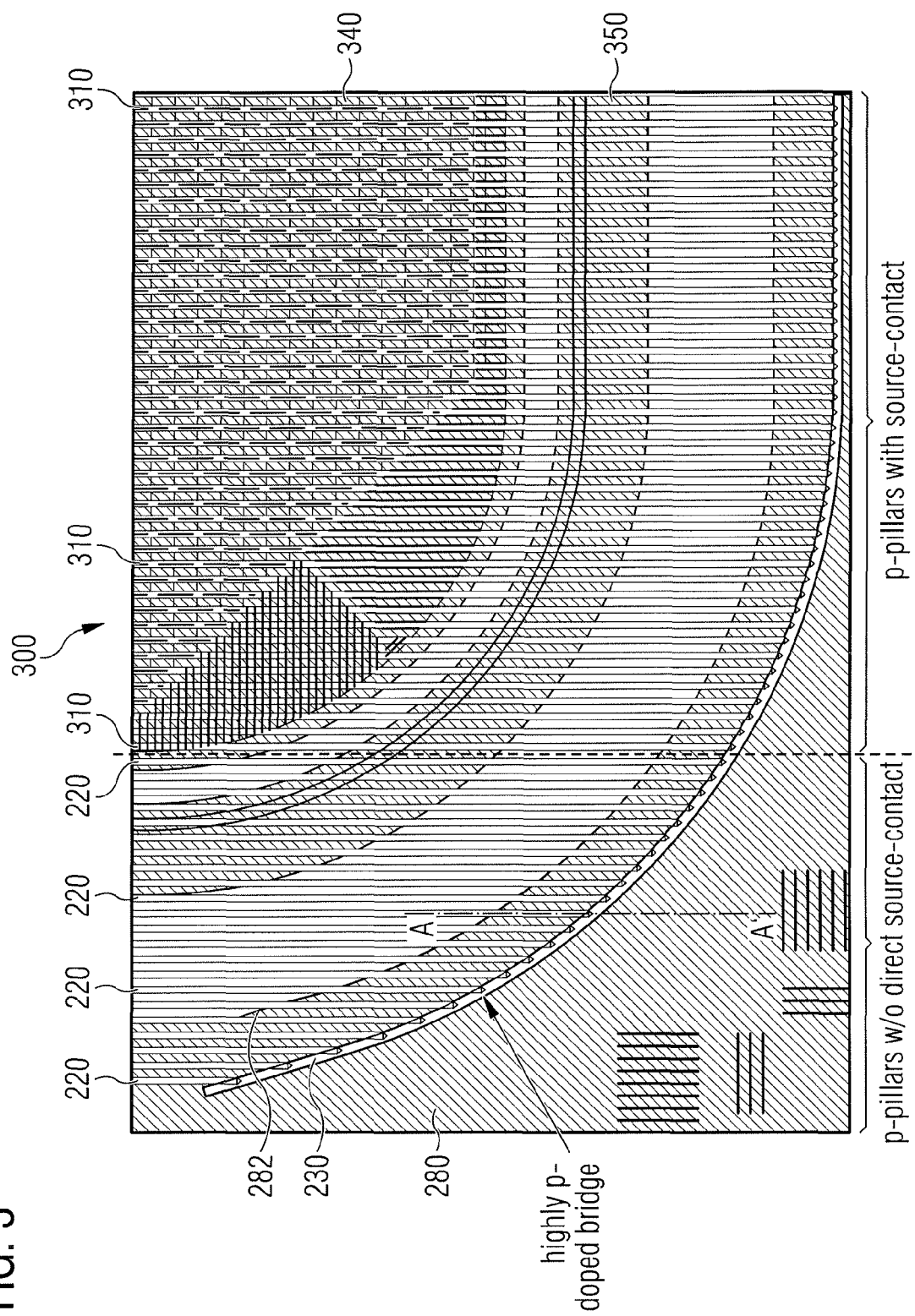
FIG. 3 shows a schematic top view of a corner region of a semiconductor device.

Further, a highly p-doped bridge structure 230 (e.g. doping concentration between $1*10^{17}$ cm$^{-3}$ and $1*10^{20}$ cm$^{-3}$) connects a lateral end of the strip-shaped edge compensation region 220 with at least one strip-shaped cell compensation region (e.g. shown in FIG. 3).

Additionally, a poly silicon contact 240 is in contact with the n-doped part of the semiconductor substrate 210 and extends through a first oxide layer 250, which covers at least a part of the semiconductor substrate surface. Further, an interlayer dielectric 260 is formed between the first oxide layer 250 and a metal plate 280. A via 270 running vertically through a contact hole in the interlayer dielectric 260 electrically connects the poly silicon contact 240 to the metal plate 280. The metal plate 280 may be a field plate or drain plate connected to a drain electrode on the back side of the semiconductor device.

Optionally, an n-doped buffer layer or field stop layer (e.g. comprising a doping concentration between $1*10^{15}$ cm$^{-3}$ and $5*10^{16}$ cm$^{-3}$) may be implemented vertically between the n-doped drift region of the field effect transistor arrangement and a highly n-doped drain or emitter layer (e.g. doping concentration between $1*10^{17}$ cm$^{-3}$ and $1*10^{20}$ cm$^{-3}$), which may be in contact with a drain or emitter electrode at a back side of the semiconductor device.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-17).

FIG. 3 shows a schematic top view of a corner region of a semiconductor device 300 according to an embodiment. The semiconductor device 300 comprises a plurality of strip-shaped cell compensation regions 310 (p-pillars with source-contact) and a plurality of strip-shaped edge compensation regions 220 (p-pillars without direct source contact). The plurality of strip-shaped edge compensation regions 220 are connected (short cut) to the plurality of strip-shaped cell compensation regions 310 by a bridge structure 230 arranged at the lateral ends of the compensation regions 310, 220. The bridge structure 230 may be a highly p-doped bridge similar to the bridge structure shown in FIG. 2. The bridge structure 230 is located below a field plate 280 (drain plate) of a drain electrode structure connected to a back side electrode of the semiconductor device 300. The bridge structure 230 extends substantially in parallel to an edge 282 of the field plate. The plurality of strip-shaped cell compensation regions 310 are connected to a field plate 340 of a source electrode structure. A field plate 350 of a gate electrode structure is arranged laterally between the field plate 280 of the drain electrode structure and the field plate 340 of the source electrode structure.

FIG. 2 may represent a cross section along the dashed line A-A', for example.

More details and aspects are mentioned in connection with the embodiments described above (e.g. FIG. 1 or 2) or below. The embodiment shown in FIG. 3 may comprise one or more optional additional features corresponding to one or more aspects mentioned in connection with the proposed concept or one or more embodiments described above (e.g. FIG. 1 or 2) or below (e.g. FIGS. 4-17).

Figure 4:
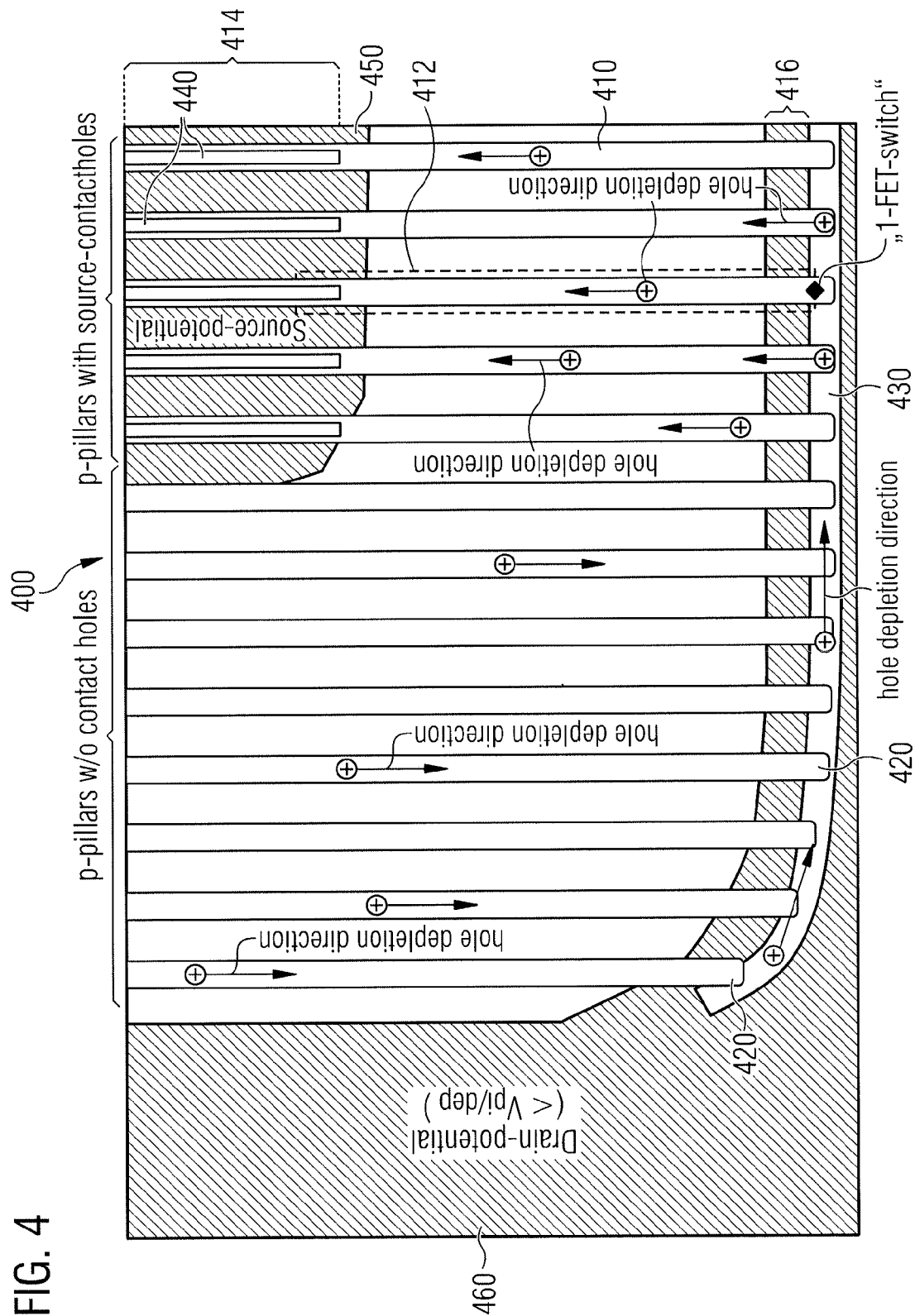
FIG. 4 shows a schematic top view of a corner region of a semiconductor device during switch-off in a first state.

The mode of operation of a proposed construction (semiconductor device) may be illustrated by FIG. 4 showing a simplified top view of a chip corner at different times during the switch off process. For example, each p-stripe (especially the stripes which are directly connected to source contact holes) are operating like an implemented cell controlled JFET switch (junction field-effect transistor) at the chip edge. For example, two states are differentiated during the switching process. One state occurs when the drain potential $V_{drain}$ is lower than the pillar depletion voltage $V_{pi/dep}$. As long as the pillars are not completely depleted (especially the JFET switches), the center of each pillar may be an equipotential surface. On the other hand, all pillars are connected to each other through the low-ohmic bridges and are consequently connected to the switched-on JFET-switch directly to the source contact holes. Consequently, outflowing holes of the charge current (shift current) follow directly the p-pillars and run on their way through no or low potential gradient. In this way, the charge current may flow off very low-ohmic and $E_{pas}$ may stay low. This state may occur until the whole (or nearly whole) free charge carriers are flown off and the pillar structure is completely or nearly completely depleted, for example.

Another state occurs if the drain voltage $V_{drain}$ is larger than the pillar depletion voltage $V_{pi/dep}$. In this case, the JFET is switched off and the ohmic connections of the edge p-stripes to the source contact holes are cut off, for example. The edge structure may now bear voltage and is blocking. The low-ohmic bridge which was pinned to source potential or close to source potential may move away from the source potential with increasing drain voltage. The low-ohmic bridge may stay fixed at $V_{drain}-V_{pi/dep}$ as an equipotential surface. The bridge structure may not disturb the reduction of the field at the chip edge, since the bridge structure may substantially follow the idealized drain surface course (e.g. parallel to the field plate). For example, nearly no voltage may occur between the drain region and the bridge structure (e.g. potential difference of the pillar depletion voltage $V_{pi/dep}$ only, for example, in the range of 20V) so that no disproportionately high fields occur at high p- and n-dopings face each other.

FIG. 4 shows that the bridge connections may be implemented very low-ohmic. In this bridge structure all holes of the displacement current from a large edge surface may be channeled. P-pillars, which are directly connected to contact holes, may be depleted earlier than p-pillars without direct contact connection (which are charged by bridges) if the voltage drop in this region (bridge structure) may be too high. This may result in an increased $E_{pas}$ value. For example, the specific conductance of the bridges may be selected at least 1 to 3 orders of magnitude above the specific conductance of the p-pillars.

Figure 5:
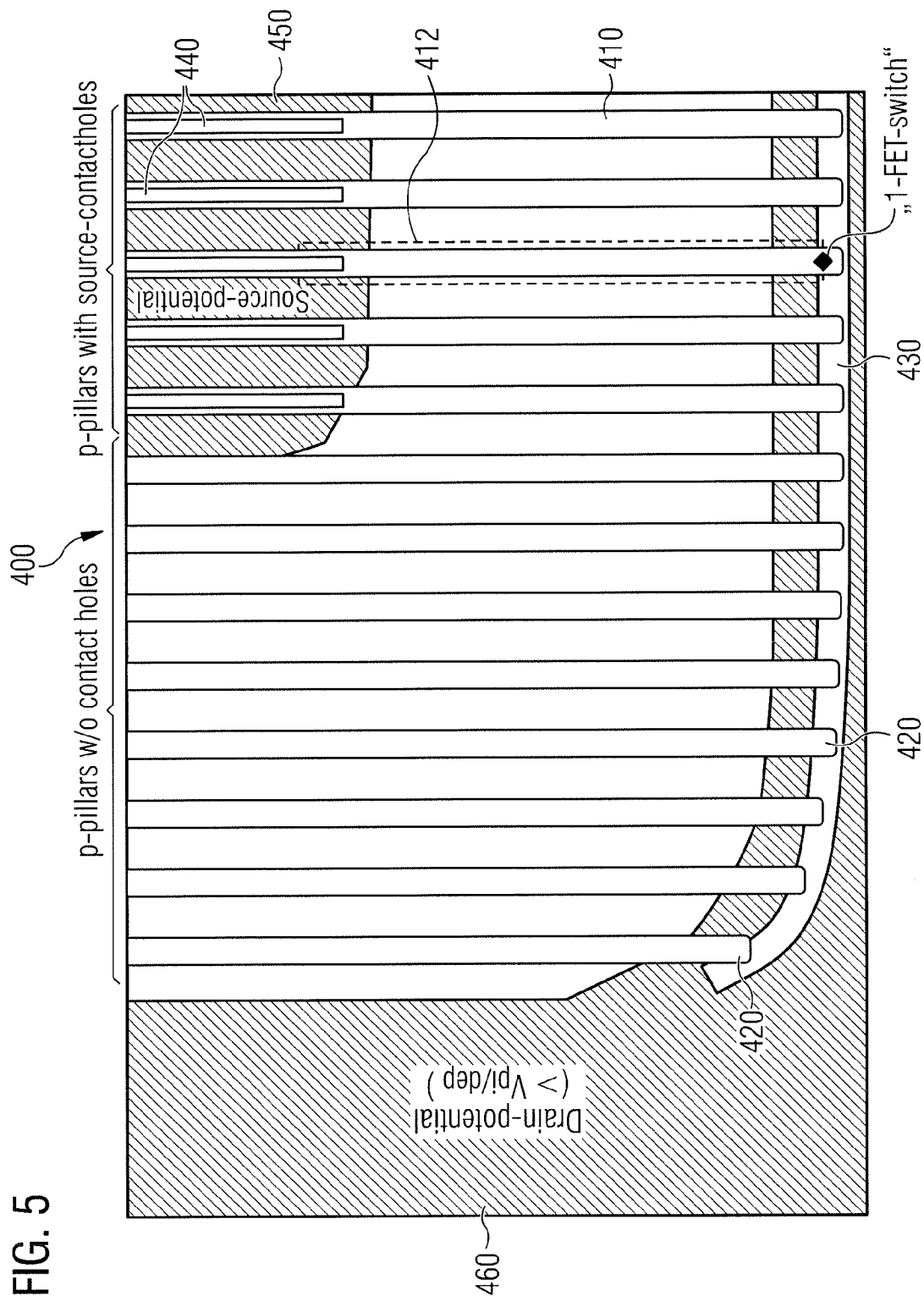
FIG. 5 shows a schematic top view of a corner region of a semiconductor device during switch-off in a second state.

FIGS. 4 and 5 may show a proposed design and illustrate a corresponding functionality. Their illustration may show a simplified top view of a chip edge. The two Figures show two states within the switching process. In phase 1 (the pre-depleted phase), the drain voltage $V_{drain}$ is lower than the pillar depletion voltage $V_{pi/dep}$. The JFET switch is not completely depleted and the full p-pillar structure and the low-ohmic bridge may be at source potential. The depletion current (holes) may follow directly the p-structure as this is not depleted and provides a low-ohmic path resulting in a small $E_{pas}$. In phase 2 (depleted phase), the drain voltage $V_{drain}$ is larger than the pillar depletion voltage $V_{pi/dep}$. In this case, the JFET switch is off and completely depleted so that the pillar structure in the junction termination can sustain the drain source voltage, for example. The low-ohmic bridge may be at a potential of the drain potential minus the pillar depletion voltage $V_{drain}-V_{pi/dep}$ (e.g. approximately $V_{drain}$). No depletion current may occur anymore. The complete junction termination structure volume (e.g. all p- and n-pillars) may be fully depleted.

FIGS. 4 and 5 show a schematic illustration of a top view of a semiconductor device during switch off of the device according to an embodiment. The semiconductor device 400 comprises a plurality of stripe-shaped cell compensation regions 410 (e.g. p-pillars with source contact holes) connected to a first electrode structure 440. The stripe-shaped cell compensation regions extend into an edge termination region outside the cell region of the semiconductor device 400. Further, the semiconductor device 400 comprises a plurality of stripe-shaped edge compensation regions 420 (e.g. p-pillars without contact holes) located in the edge termination region outside the cell region of the semiconductor device 400. The plurality of stripe-shaped edge compensation regions 420 are arranged substantially in parallel to the plurality of stripe-shaped cell compensation regions 410. Additionally, the semiconductor device 400 comprises a bridge structure 430 electrically connecting the plurality of stripe-shaped edge compensation regions 420 with the plurality of stripe-shaped cell compensation regions 410 at the ends of the stripe-shaped cell compensation regions and the stripe-shaped edge compensation regions 420. The bridge structure 430 comprises a shape substantially following a shape of an inner edge of the drain electrode 460 (drain plate) at drain potential. The strip-shaped cell compensation regions 410 connected to the bridge structure 430 may comprise a first part 414 being located in the cell region and being in contact with the first electrode structure 440 and a second part 416 (or end portion) being located in the edge termination region and being in contact with the bridge structure 430.

The plurality of stripe-shaped cell compensation regions 410 is connected to a source plate 450 at source potential through lines of contact plugs or line-shaped contacts 440 arranged vertically between the semiconductor substrate and the source plate, for example. The charge carriers within the stripe-shaped edge compensation regions 420 (e.g. holes) are depleted through the bridge structure 430 and the stripe-shaped cell compensation regions 410 to the source electrode structure 440 during switch off of the semiconductor device 400. The part of the stripe-shaped cell compensation regions 410 located between the source contacts and the bridge structure 430 within the edge termination region may function as junction field-effect transistor switch. The JFET switch may contract the conduction channel between the bridge structure 430 and the source contacts 440 with increasing source-drain voltage.

The holes, which flow off from the edge regions, may be pushed from the depth of the voltage bearing volume to the surface due to the voltage course, for example. Therefore, the bridges may be positioned close to the surface or may be at least partly transferred onto the surface.

According to an aspect, p-pillar stripes are connected to each other by usage of conductive bridges at the chip edge so that floating regions are eliminated or reduced. The bridges may be implemented low-ohmic. Further, the bridges may reproduce or may form an idealized form of an equipotential line in terms of their potential and/or course and may consequently run in parallel or equidistant to an edge potential plate (e.g. drain plate). For example, a position close to the drain region may be used (e.g. a connection of p-stripe ends at the outer chip region). Further, the bridges may connect all p-stripes which are not directly connected to contact holes (stripe-shaped edge compensation regions) to several cell field connected p-stripes (stripe-shaped cell compensation regions).

As already mentioned, the $E_{pas}$ may be reduced or minimized by implementing the proposed bridge structure. Additionally to the $E_{pas}$ improvement, the voltage stability of the chip edge may be improved.

The proposed concept may be implemented for trench compensation devices as well as for a multi-epi/multi-implant approach, for example.

The low-ohmic bridges may be implemented in various ways. For example, the bridges may be implemented as transverse p-pillars with several p-pillars switched or connected in parallel and/or implemented broader than within the cell field. Additionally or alternatively, p-regions at the surface may be implemented, which are doped significantly higher (e.g. similar to the body region or body contact area).

Alternatively or additionally, the bridges may be implemented on top of the semiconductor by usage of metal layers, silicide layers and/or poly layers (polysilicon layer), which are connected to the p-pillars by contacts (via or plug between metal layer and semiconductor). Alternatively, continuous plugs (contacts, vias) may be used, which may be insulated from the n-pillars by p-regions.

The bridges may be connected to single stripes supplied with source contact holes (directly connected to the source electrode) or to the full cell field (e.g. FIGS. 6A and 6B), for example.

Figure 6A:
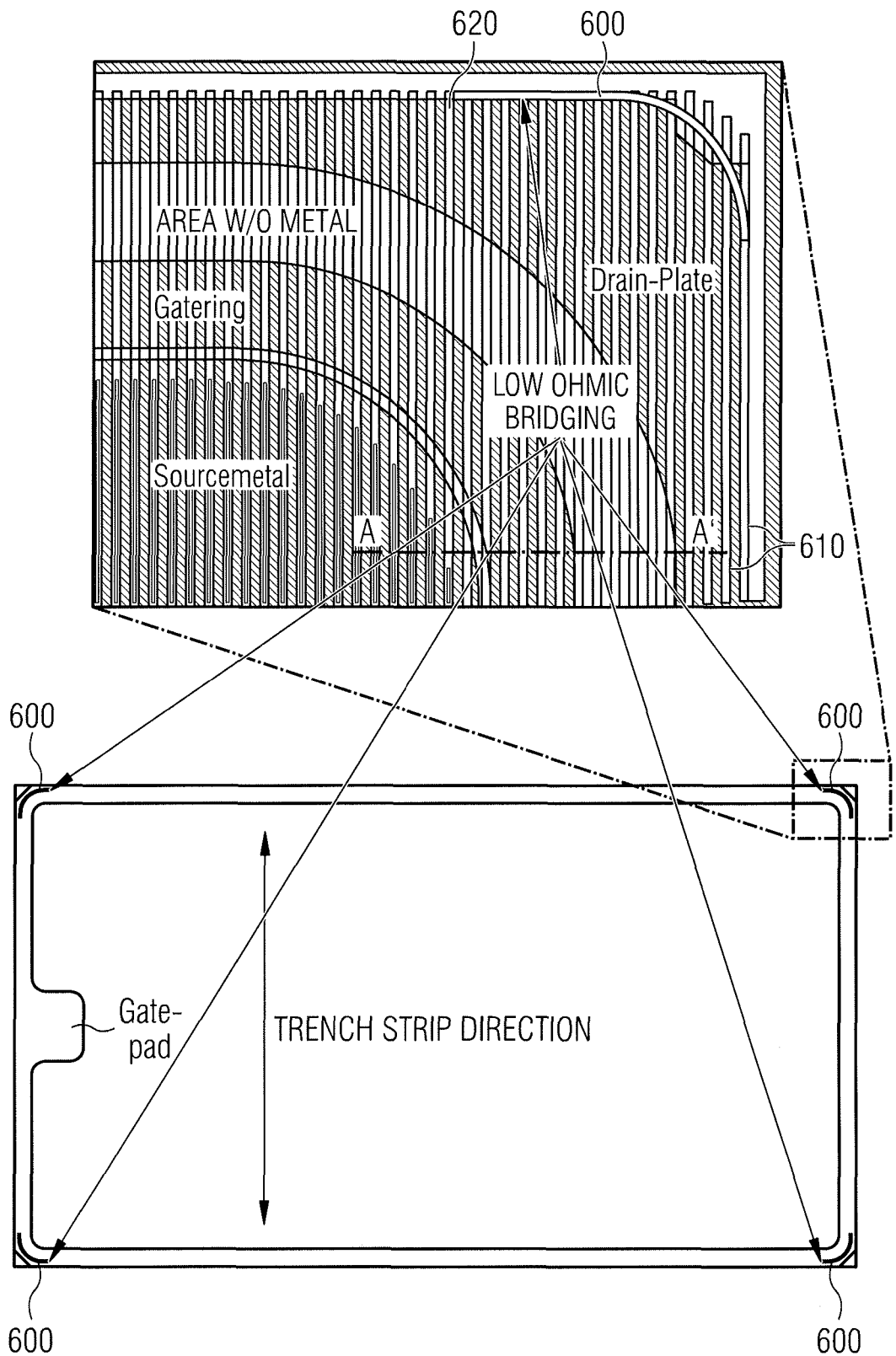
FIG. 6A shows a schematic top view of a semiconductor device and a detail of a corner region of the semiconductor device with a bridge structure in each corner.
Figure 6B:
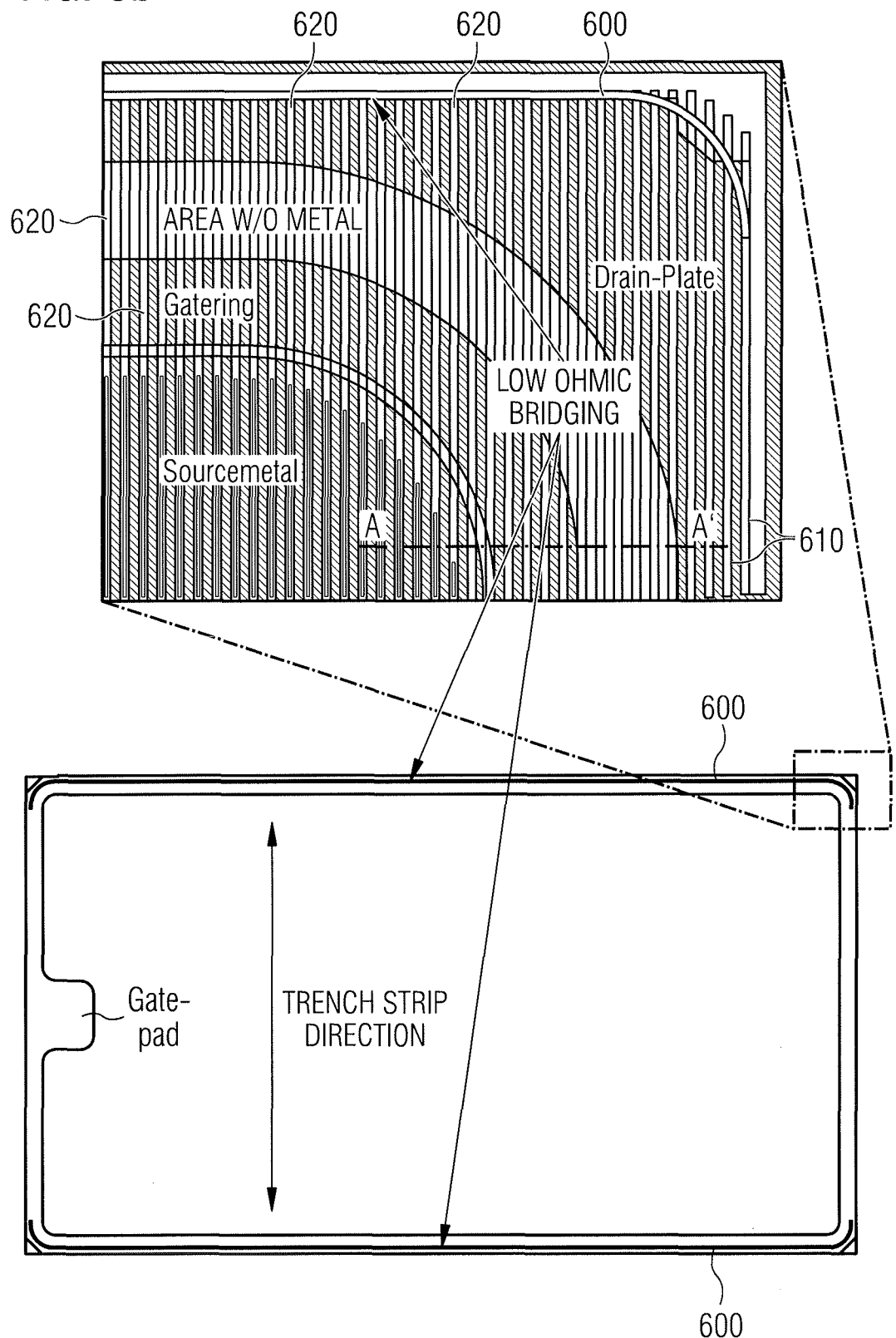
FIG. 6B shows a schematic top view of a semiconductor device and a detail of a corner region of the semiconductor device with bridge structures at two opposite sides of the semiconductor device.

FIG. 6A shows an example of a low-ohmic bridging in the chip corners and FIG. 6B shows an example of a low-ohmic bridging over the whole chip side. FIGS. 6A and 6B show a top view of a semiconductor device and a detail of a corner of the semiconductor device being implemented similarly to the semiconductor device shown in FIGS. 14 and 15. The semiconductor devices shown in FIGS. 6A and 6B comprise proposed bridge structures 600.

A plurality of strip-shaped cell compensation regions 620 and a plurality of strip-shaped edge compensation regions 610 are arranged substantially in parallel to an edge of the semiconductor substrate. A bridge structure 600 electrically connecting at least one strip-shaped edge compensation region 610 of the plurality of strip-shaped edge compensation regions 610 with at least one strip-shaped cell compensation region 620 of the plurality of strip-shaped cell compensation regions 620 is arranged within the edge termination region at each corner of the semiconductor substrate.

FIG. 6A shows an example of a semiconductor device comprising bridge structures in all four corner regions connecting a plurality of strip-shaped edge compensation regions 610 to at least one stripe-shaped cell compensation region 620 (e.g. only one stripe-shaped cell compensation region). Alternatively, the bridge structure 600 extends along the whole chip in a direction orthogonal to a trench stripe direction (e.g. direction of largest lateral extension of stripe-shaped cell compensation regions). In this way, all stripe-shaped edge compensation regions 610 are connected to all stripe-shaped cell compensation regions 620.

Further details of the different elements may be described in connection with FIGS. 14 and 15 or with one or more embodiments described above (e.g. FIG. 1) or below.

Some embodiments relate to a stripe layout with stripes extending either in parallel or perpendicular to a chip boundary. Alternatively, only two of four chip corners may remain as floating areas with a stripe layout rotated by 45° so that bridges may be implemented in these areas only.

Figure 7A:
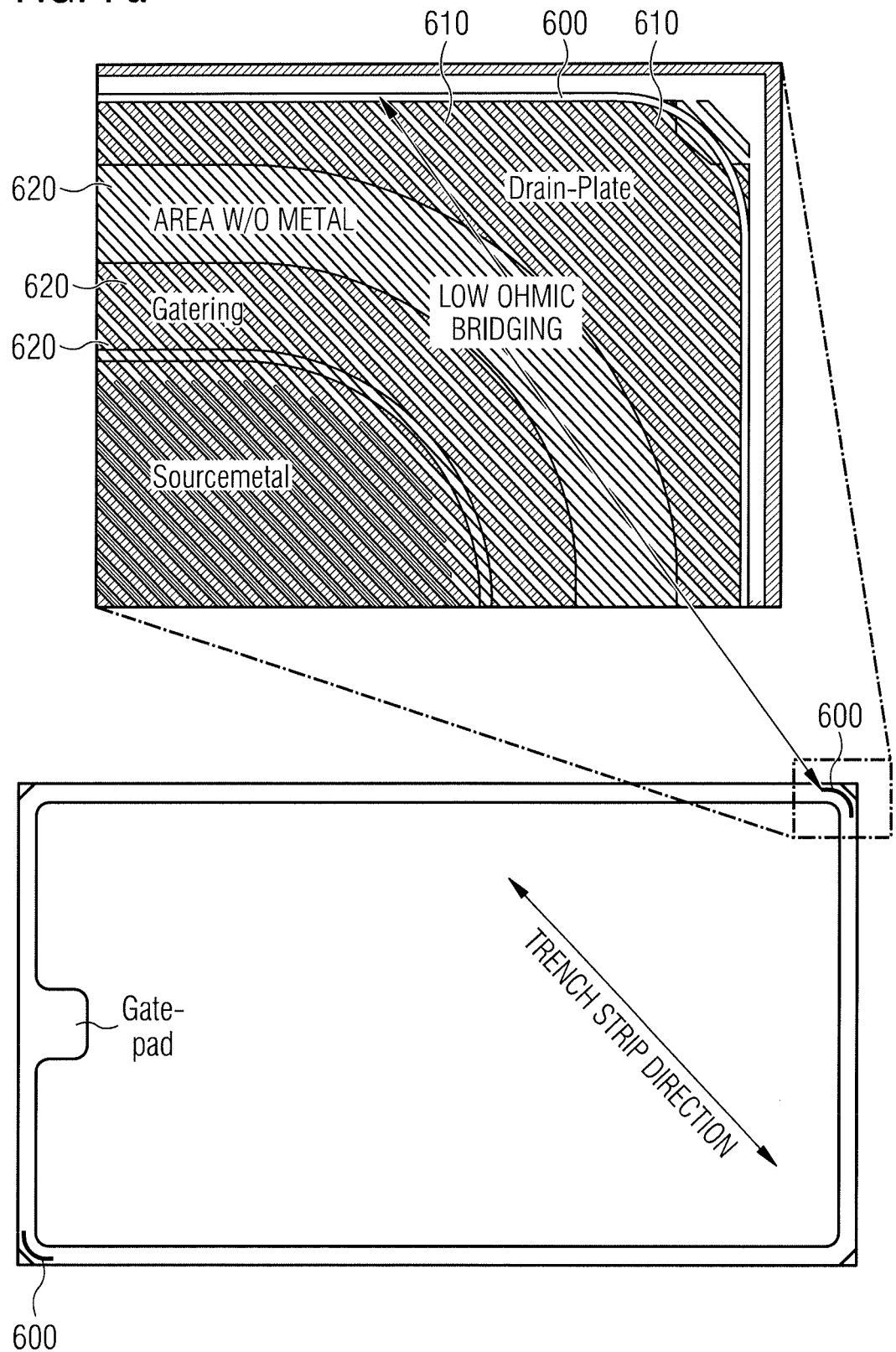
FIG. 7A shows a schematic top view of a semiconductor device and a detail of a corner region of the semiconductor device comprising tilted compensation structures and bridge structures in two opposite corner regions.
Figure 7B:
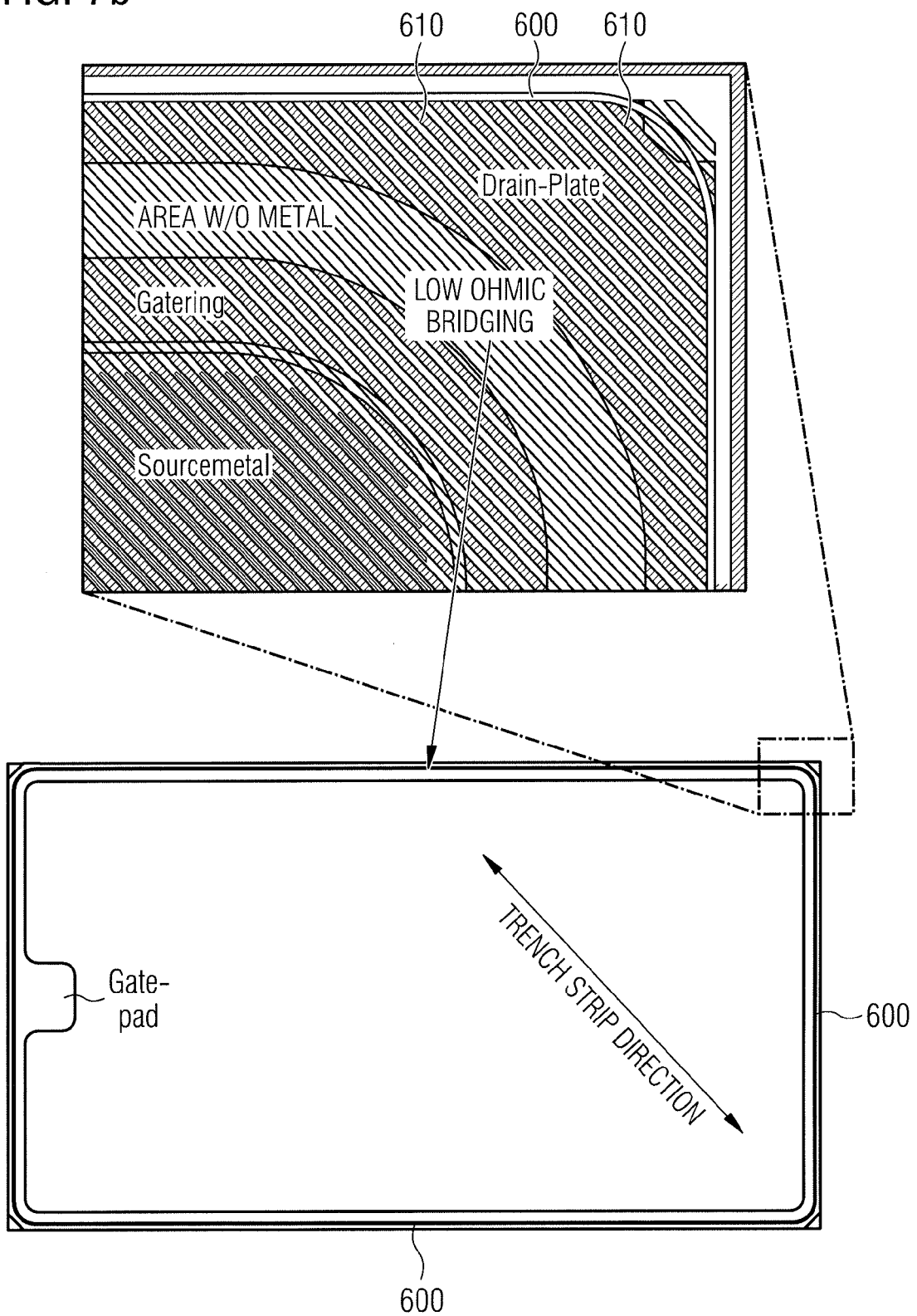
FIG. 7B shows a schematic top view of a semiconductor device and a detail of a corner region of the semiconductor device comprising tilted compensation structures and a bridge structure surrounding the whole semiconductor device.

FIGS. 7A and 7B show examples of chip sections of semiconductor devices with a stripe layout of the pillar structure tilted with respect to the chip edges. The semiconductor devices of FIGS. 7A and 7B are implemented similarly to the semiconductor devices of FIGS. 6A and 6B with different trench stripe direction.

A plurality of strip-shaped cell compensation regions 620 and a plurality of strip-shaped edge compensation regions 610 are arranged substantially in parallel to a common strip direction. An angle between the common strip direction and an edge of the semiconductor substrate is substantially 45°. Alternatively, the angle between the common strip direction and an edge of the semiconductor substrate may be between 20° and 70° (or between 30° and 60°). A bridge structure 600 electrically connecting at least one strip-shaped edge compensation region 610 of the plurality of strip-shaped edge compensation regions 610 with at least one strip-shaped cell compensation region 620 of the plurality of strip-shaped cell compensation regions 620 may be arranged within the edge termination regions at opposite corners of the semiconductor substrate (e.g. only).

Due to the tilted arrangement of the stripe-shaped cell compensation regions 620 and the stripe-shaped edge compensation regions 610, the implementation of two bridge structures 600 located at two opposite corner areas of the edge termination region of the semiconductor device may be sufficient for connecting the stripe-shaped edge compensation regions without direct contact to the source electrode through at least one stripe-shaped cell compensation region 620 as shown in FIG. 7A. Alternatively, the bridge structures 600 may surround the whole cell field within the edge termination region as shown in FIG. 7B, for example.

Further details of the different elements may be described in connection with FIGS. 14 and 15 or with one or more embodiments described above (e.g. FIG. 1) or below.

In some examples, the bridges are arranged in a region close to the drain. Alternatively, the bridges may be put to an intermediate voltage and abstain from also connecting the last outermost stripes, for example. For example, the bridges may be positioned between the source plate and the drain plate. However, the bridges may still reproduce an equipotential line in an idealized form by their position and course (e.g. extending in parallel and/or equidistant to the edge potential plate).

The proposed bridges may enable an improvement of the voltage stability of the chip edge.

The utilization of floating regions at the chip edge may result in a depletion zone reaching only to a part of the chip edge in the blocking case. In this case, a large part of the chip edge cannot contribute to the voltage reduction and this area may be wasted. The occurring fields may be significantly higher at a given blocking voltage than for a chip edge contributing in its full width to the voltage reduction. A large field strength relaxation may be obtained by implementing proposed bridge structures due to the avoidance or reduction of floating regions and a field-related stabilization of the chip edge may be obtained. This may be shown by a simplified device physical module described below.

For example, the chip edge may be nearer to the cell field with respect to its blocking capability. Half of the p-pillar may be depleted against half of the corresponding n-pillar within the cell field (e.g. depletion voltage in the cell field $V_{cf}$). In comparison to a chip edge with floating stripes, a second weakening effect may contribute within the cell field. The fields, which are generated by the stripe depletion (horizontal fields) may be vectorially added to the fields, which are generated due to the vertical depletion. The resulting overall fields may be significantly lower (e.g. approximately factor 1.4) than the scalar sum of the fields.

Figure 8:
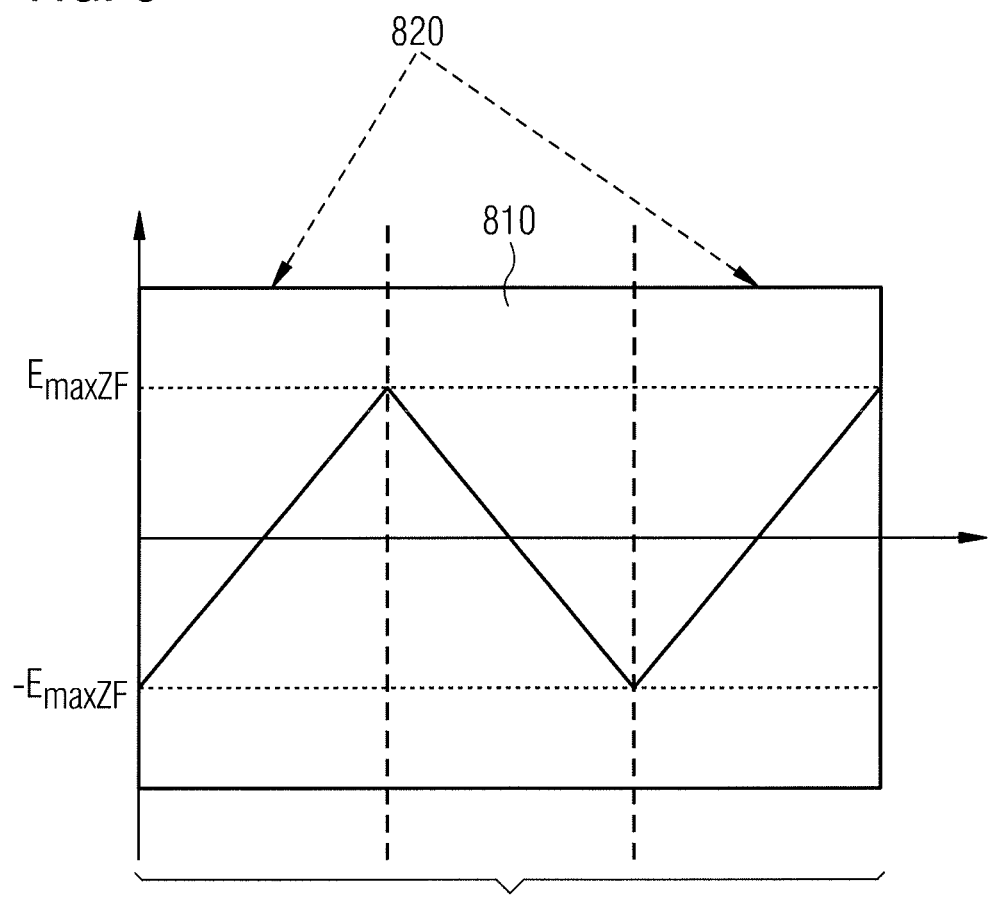
FIG. 8 schematically illustrates the electric field within the cell field of a semiconductor device in a depleted state.

FIG. 8 shows a schematic illustration of an electric field condition at pillar depletion within the cell field. The charges (e.g. free charge carriers) are completely or nearly completely depleted or cleared from the cell field. FIG. 8 illustrates the electric field rising from a maximal electric field $-E_{maxcf}$ to a maximal electric field $E_{maxcf}$ within the contacted p-regions 820 of the cell field and decreasing from the maximal electric field $E_{maxcf}$ to the minimal electric field $-_{maxcf}$ in the n-doped drift regions of the cell field. Only half of the first n-stripe may be depleted at a voltage $V_{cf}$ (depletion voltage) in the case of floating charge stripes at the chip edge (e.g. without proposed bridge structures) so that the resulting field is equal to $E_{maxcf}$ as shown in FIGS. 9A and 9B. FIG. 9A illustrates an example of the electric field conditions at a location within the cell field in the case of floating p-pillars at the chip edge. Within the cell field, contacted p-regions 910 are neighboring n-regions 930 and in the chip edge region floating (non-contacted) p-regions 920 are neighboring n-regions 930. Further parts of the first n-stripe may be reached by the depletion zone, if the voltage is further increased. Finally, the n-stripe is completely depleted towards the cell field (against the highly-doped region, e.g. the body closest to the edge). For example, a source-drain blocking voltage $V=4\times V_{cf}$ may be applied in order to completely deplete or clear the first floating n-stripe in the edge region. Simultaneously, the maximal electrical horizontal field may be doubled in comparison to the cell field as indicated in FIG. 9A.

The closest p-n-region may be reached by the depletion zone, if the voltages are further increased (e.g. $V>4\times V_{cf}$) starting the depletion process again as indicated in FIG. 9B. Consequently, only a part of the edge volume may be used for the voltage reduction at higher blocking voltages.

The chip edge may comprise an equal or similar depletion behavior as the cell field, if proposed bridges connect floating p-pillars at the chip edge with non-floating stripes (e.g. below the voltage $V_{cf}$ as shown in FIG. 10). In this way, a field-related relaxation of the chip edge may be enabled.

FIG. 10 shows an example of an electric field condition at pillar depletion within the cell field in the case of non-floating p-pillars at the chip edge. In the cell field, p-regions 1010 directly connected to the source electrode structure are neighboring n-regions 1030 and in the chip edge region p-regions 1020 indirectly connected through bridge structures are neighboring n-regions 1030. The charge carriers may be completely or nearly completely cleared or depleted within all stripe-shaped or pillar-shaped compensation regions due to one or more bridge structures.

Figure 11A:
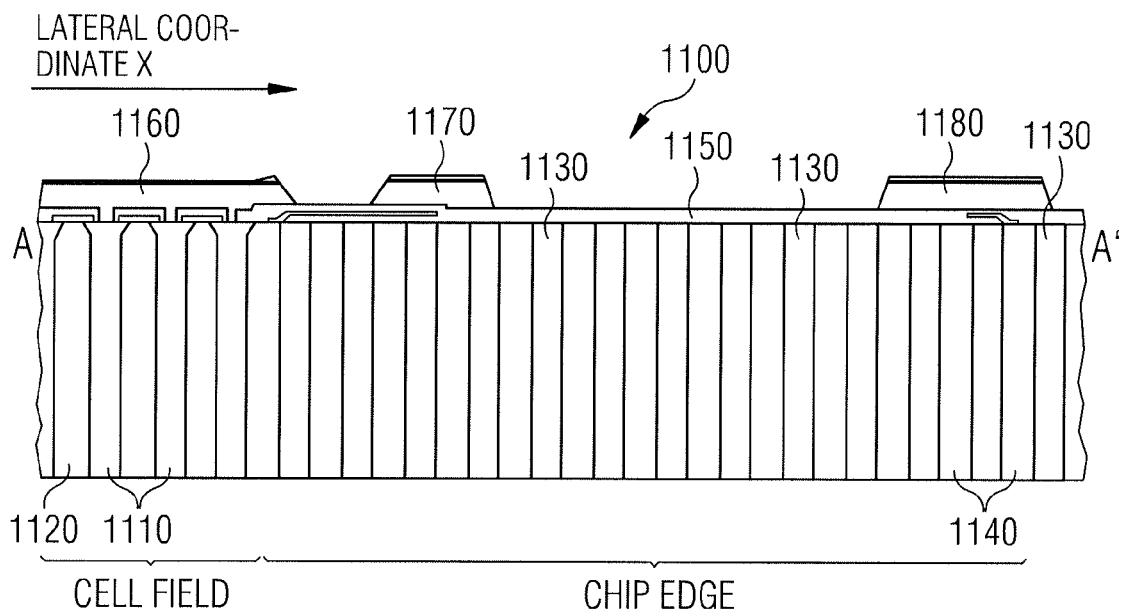
FIG. 11A shows a schematic cross-section of a semiconductor device.
Figure 11B:
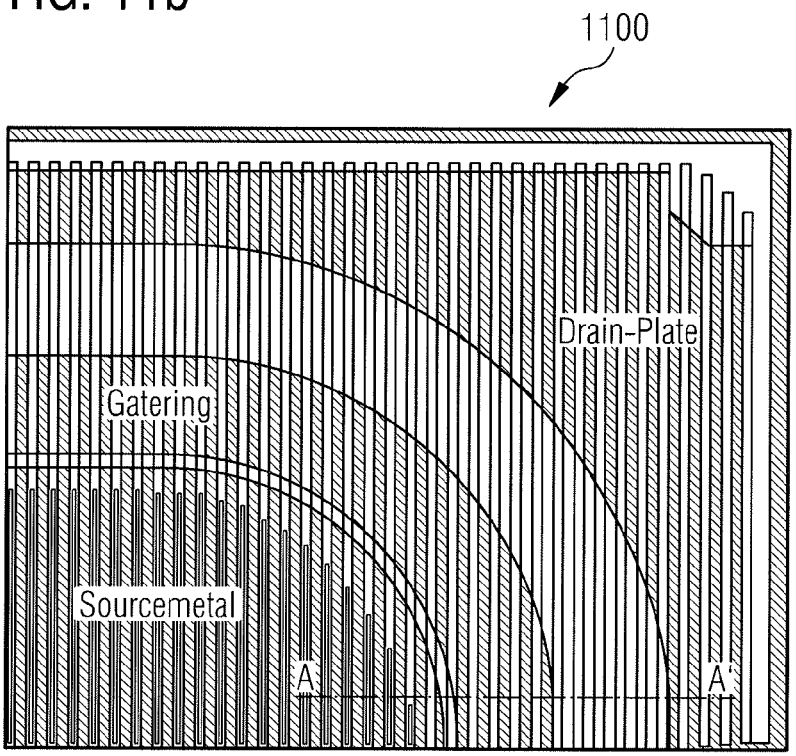
FIG. 11B shows a schematic top view of a corner region of the semiconductor device shown in FIG. 11A.

FIG. 11B shows a schematic top view of a corner region of the semiconductor device and FIG. 11A shows a cross section along dashed line A-A' in FIG. 11B. The implementation of the semiconductor device 1100 is similar to the implementation shown in FIG. 14.

FIG. 11A shows a plurality of stripe-shaped cell compensation regions 1110 separated from each other by a plurality of stripe-shaped drift regions 1120 within the cell field. The cell field comprises a plurality of field effect transistor cells. Each field effect transistor cell comprises a body region and a stripe-shaped cell compensation region within a common p-doped region of the semiconductor device. A source region of the field effect transistor cell is embedded in the common p-doped region. The source region and the body region (and consequently also the stripe-shaped cell compensation region) of a field effect transistor cell are short cut by the source electrode structure 1160 (e.g. source contacts and source metal plate). A gate is located in proximity of the body region insulated from the body region by a gate insulation layer to enable a control of a current flow between the source region and the drift region 1120 through the body region. The sources regions, the body region and the strip-shaped cell compensation regions of the field effect transistor cells are connected to the source metal. The gates of the field effect transistor cells are connected to a gate ring 1170 laterally surrounding the source plate 1160 outside the cell field. Further, a drain plate 1180 is located along an edge of the semiconductor device 1100 laterally surrounding the gate ring 1170. The drain plate 1180 is connected to a back side drain electrode of the semiconductor device 1100. A current from the source electrode structure 1160 to the backside electrode structure may be controllable by a voltage applied to the gate ring 1170.

Additionally, the semiconductor device 1100 comprises a plurality of p-doped stripe-shaped edge compensation regions 1130 separated from each other by a plurality of inactive stripe-shaped n-doped regions 1140.

A part of the gate ring 1170 and a part of the drain plate 1180 are located above at least a part of the p-doped stripe-shaped edge compensation regions 1130. The gate ring 1170 and the drain plate 1180 are insulated from the p-doped stripe-shaped edge compensation regions 1130 by an oxide layer between the semiconductor substrate and the gate ring 1170 and the drain plate 1180.

The plurality of stripe-shaped cell compensation regions 1110, the plurality of stripe-shaped drift regions 1120, the plurality of p-doped stripe-shaped edge compensation regions 1130 and the plurality of inactive stripe-shaped n-doped regions 1140 may implement a (periodic) pillar structure.

At least one stripe-shaped edge compensation region 1130 is connected to at least one stripe-shaped cell compensation region 1110 by a bridge structure (not shown in FIGS. 11A and 11B) as mentioned above (e.g. FIG. 1) or below.

FIGS. 11A and 11B may show a schematic cross-section and a top view of a chip edge/chip corner. The compensation structure is implemented according to a stripe layer.

More details and aspects are mentioned in connection with the embodiments described above or below. The embodiment shown in FIGS. 11A and 11B may comprise one or more optional additional features corresponding to one or more aspects mentioned in connection with the proposed concept or one or more embodiments described above (e.g. FIG. 1-10) or below (e.g. FIGS. 12-17).

Some embodiments relate to a chip edge concept for compensation devices and optimization of Epas and stabilization of the break through.

The following examples mainly relate to vertical n-channel conduction elements according to the compensation concept. However, the described concept may be similarly applicable to a p-channel element also.

Modern semiconductor chips are often implemented as vertically conducting elements, which means that their electric current flows from source at the chip front side to drain at the back side in the on state. Therefore, the overall voltage applied to the chip with respect to the cell field is to be degraded or reduced in vertical direction. The chip backside may be implemented as common drain so that drain potential exists on each point of the backside. If the front side would be built as an equipotential area, the whole blocking voltage would drop down at the vertical chip edge plane (kerf or dicing street), which may be negative for the leakage current or blocking behavior. In order to keep these planes field free, the drain potential is pulled up to the front side at the chip edges. In this way, the cell field being on source potential is embedded in a drain potential well in its entirety. The chip edge can be used to decrease the source drain voltage in lateral direction in a controlled manner. For example, complex structures positioned at the surface or close to the surface may lead to a chip edge capable of blocking more voltage than the cell field.

Regarding the implementation of the silicon volume, the deeper located semiconductor volume (homogeneous) of some power devices may be so lowly doped that it may hold the required voltage without structuring. For compensation devices the requirements may be higher so that (e.g. neglecting alternatives with completely undoped chip edge) also the silicon volume below the edge may be structured by charge carrier pillars (e.g. the net doping may be sufficiently low).

Since a common drain concept is often used, all n-charge regions may be in ohmic contact to the backside, for example. This may be different for the p-regions. Depending on the cell and chip edge structure, at least a part of the p-pillars has no direct ohmic contact to the contact holes so that these regions are floating. The charge carriers may cross very high ohmic regions on their way to the source region (e.g. they may cross n-doped regions in order to reach the contact holes driven by a potential), if such regions are cleared from holes in the switch-off case. In this way, high switching losses may occur, which may be quantized with the parameter E-passive (energy passive). This case may be called first order floating effect and the corresponding loss may be called $E_{pas1}$.

A related effect (e.g. so-called second order floating effect) may lead to similarly high losses $E_{pass2}$ even if the p-pillars are directly connected to the contact holes. P-regions, which are directly connected with the contact holes and located closer to the source region within the hole path, may be already earlier fully depleted during the switching processes than p-regions located farther away due to an inappropriate depleting behavior. In this way, quasi floating p-charge clusters may be generated, which may lead to a loss kinetic nearly equal to the first order floating effect.

Regarding the first order floating effect, the chip edge of compensation devices may be stabilized in terms of voltage by reducing the charge content of the pillars in comparison to the cell field. For example, the p- and n-pillars at the chip edge may be significantly narrower as in the cell field in the case of stripe cells. Additionally, an interdiffusion for intrinsic compensation due to the temperature budget during the manufacturing process may occur and therefore lead to an additional strong reduction of electrically active charges. In this way, a reduction of $E_{pas}$ additionally to the desired voltage stabilization at the chip edge may be obtained, since only a few charges may remain, which have to be led away from the floating regions in the switching case.

An increase of the systematic may be reached by implementing the whole chip edge undoped so that no charge may remain at the edge.

All measures may be easily implemented with a multi-epi/multi implantation process implementing the p-as well as the n-charges by photo masks and corresponding implantations. In this case, the actual epilayer (epitaxial layer) may be undoped.

Figure 12:
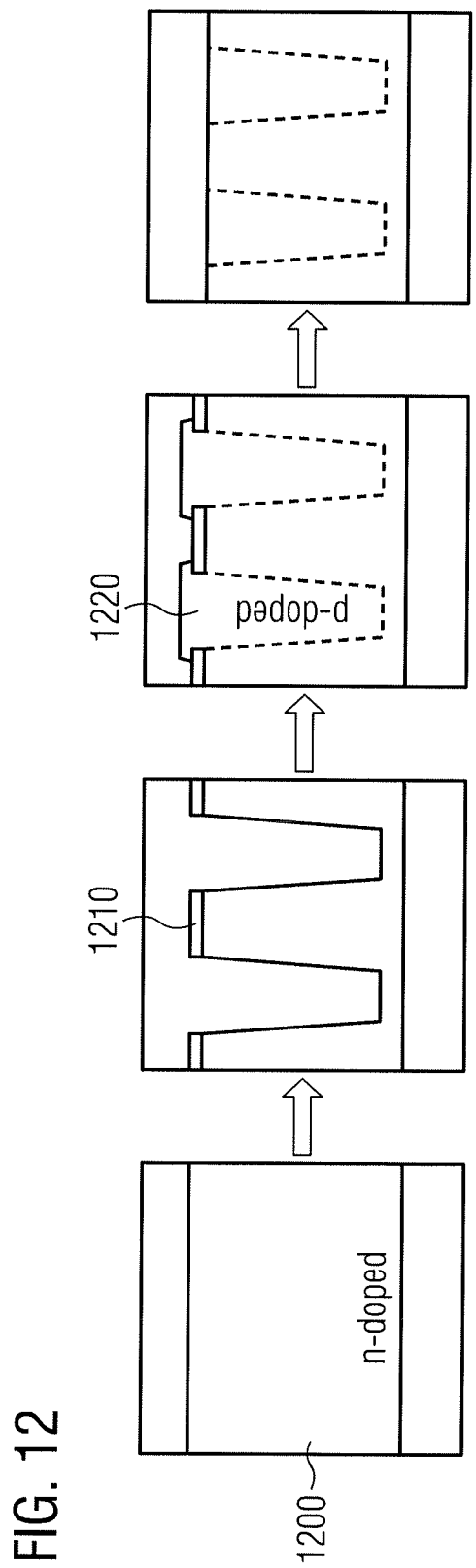
FIG. 12 shows a schematic illustration of the manufacturing process of a trench compensation device.

Alternatively, the compensation region may be formed by a trench process. FIG. 12 may show an example of a schematic process caused by a cross-section through a cell field cell for the manufacturing of a trench compensation device. For example, an n-doped epitaxial layer 1200 is grown on a substrate and a mask layer 1210 (e.g. oxide layer) may be deposited on the epitaxial layer 1200. Then, the mask layer 1210 is structured and trenches are etched at positions which are uncovered by the mask layer 1210. Afterwards, the trenches are filled by p-doped semiconductor material 1220 and the mask layer 1210 is removed, for example. An oxide may be deposited and a cell process may be performed.

The mentioned measures may be difficult or cost intensive, if the manufacturing is based on a trench process. An example of the corresponding process course is shown by a schematic cross-section in FIG. 12. In this example, the cells may have a stripe shape layout. The stripe structure may comprise additionally to the cell field also the whole chip edge and is therefore continued to the drain region. For example, FIGS. 11A and 11B show an example of a cross-section and a chip section of the chip edge/corner region and a small part of the cell field. The p-epi filling of the trenches may be homogeneously doped similar to the n-base epi (epitaxial layer). For example, the p-charge content cannot be varied independent from the n-charge content in such a layout. The broader the p-pillars the more p-charges occur, but simultaneously also less n-charges. Therefore, it may be impossible to reduce the charge content of both charge types at the chip edge and simultaneously maintain or control the compensation at the stripe design by layout-related measures. Also an undoped chip edge may be impossible, since the epilayer is already deposited n-doped, for example.

The reduction of the charge content in the chip edge may be implemented more easily by other cell layouts (e.g. by island-shaped cells, for example, round, square, hexagonal, arranged in a hexagonal structure). However, such layouts may comprise undesired large manufacturing tolerances for the trench compensation approach.

Regarding the second order floating effect, an important influence may be the load profile or tendency profile (n-load or p-load). For example, the pillar structure may implemented with a p-load at the top and an n-load at the lower regions in terms of the charge balance (e.g. in the case of an n-channel device) to obtain a maximal or increased robustness and a large manufacturing window, for example. In this way, a quasi p-n-junction in the region of the half pillar height may be obtained. This measure may also improve or minimize the factor $E_{pas}$. Further features for a parallel optimization or improvement of $E_{pas}$ within the cell field at simultaneous optimization or improvement of the robustness during avalanche breakthrough and the BVDSS-manufacturing window (breakdown voltage between drain and source while the gate is on source potential) may be (e.g. for an n-channel device) a continuous decrease of the charge content (e.g. horizontal area charge) within the p-pillar from the source in the direction of the drain, a continuous increase of the charge content (e.g. horizontal area charge) within the n-pillar from the source in the direction of the drain (continuous increase) and/or a continuous reduction of the charge balance within the pillar volume from + (p-load at the device surface close to the source) in the direction − (n-load in the deep-regions closer to the drain) so that a cross p-n-junction may be obtained at about half of the trench depth for a device with the target parameter. Corresponding measures may be implemented at the chip edge for minimizing or reducing $E_{pas}$ so that a corresponding lateral profile may be obtained.

Figure 13:
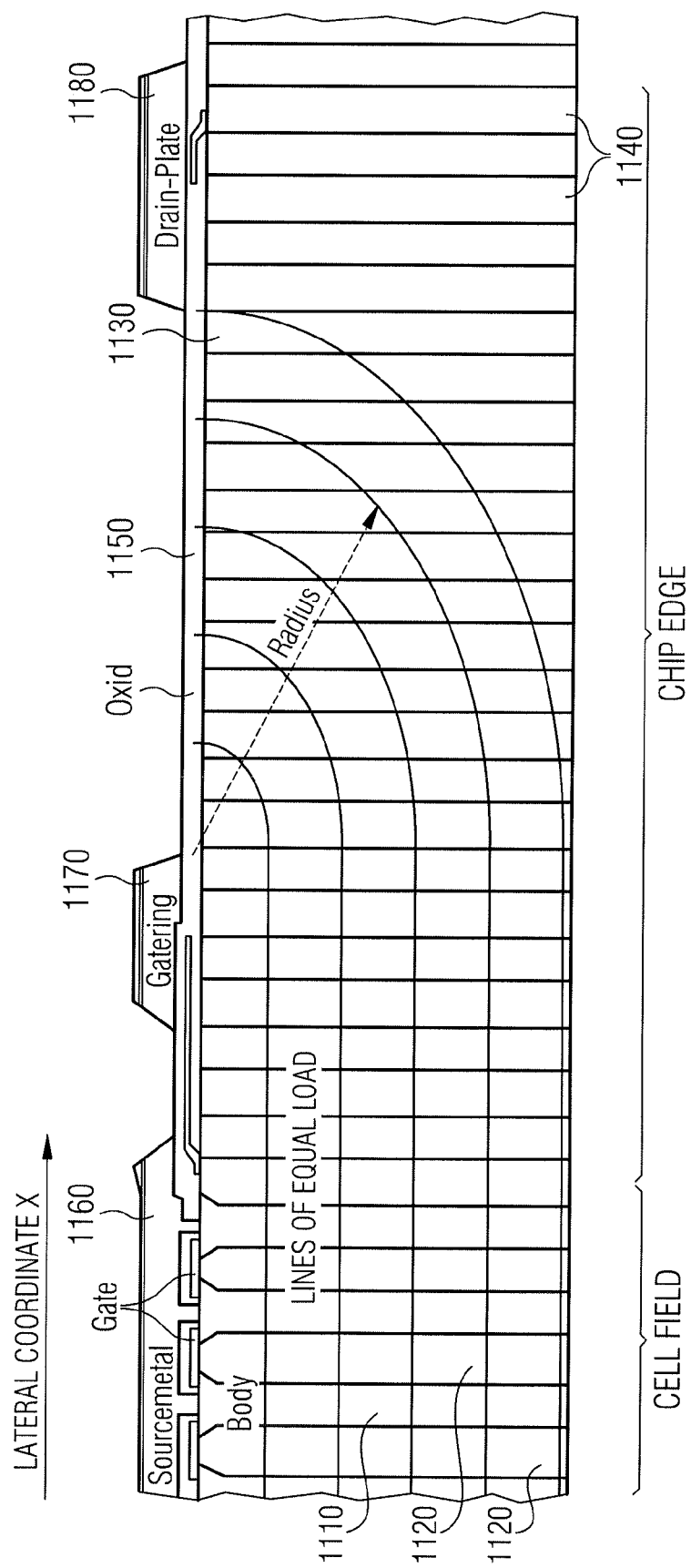
FIG. 13 shows a schematic cross-section of a semiconductor device with varying charge carrier load.

FIG. 13 shows a semiconductor device implemented similar to the semiconductor device shown in FIGS. 11A and 11B. FIG. 13 shows an example of a load profile within a silicon volume comprising a pillar structure. FIG. 13 may show an example of a schematic cross-section of the load profile at the chip edge and the cell field, if the measures mentioned above are implemented in both chip regions. In this way, a second order floating effect may be avoided or reduced in both chip regions.

The proposed concept of one or more embodiments above may enable an optimization or improvement of the parameter $E_{pas}$ for the chip edge of a compensation device with stripe layout (e.g. also for a trench manufacturing method) with respect to the first order floating effect.

An application of a proposed transistor may be a resonant application, although also hard switching applications may be possible. During a hard switching application, the floating part of the edge may be depleted during the first switching cycles and may remain in this state in the on state also. Therefore, an $E_{pas}$ due to the first order floating effect might not occur or may be negligible.

In contrast, the floating region may be flooded with charge carriers at each switching cycle at resonant circuits (e.g. since a charge filling through the reverse diode injection may occur) so that a permanent charging and discharging with the corresponding switching losses from $E_{pass1}$ may occur.

For example, the stripes may run in parallel or vertically with respect to the chip edges, if a stripe layout is used. Consequently, floating regions may be formed at both sides of the cell field (without proposed bridge structure), which may extend along the whole edge length of the chip and consequently extending over a very large area. For example, FIG. 14 may show a similar chip section as FIG. 11B indicating the contact hole stripes 1430. All p-stripes 1420 (stripe-shaped edge compensation regions) which are not connected to a contact hole, are floating (without proposed bridge structure).

Figure 14:
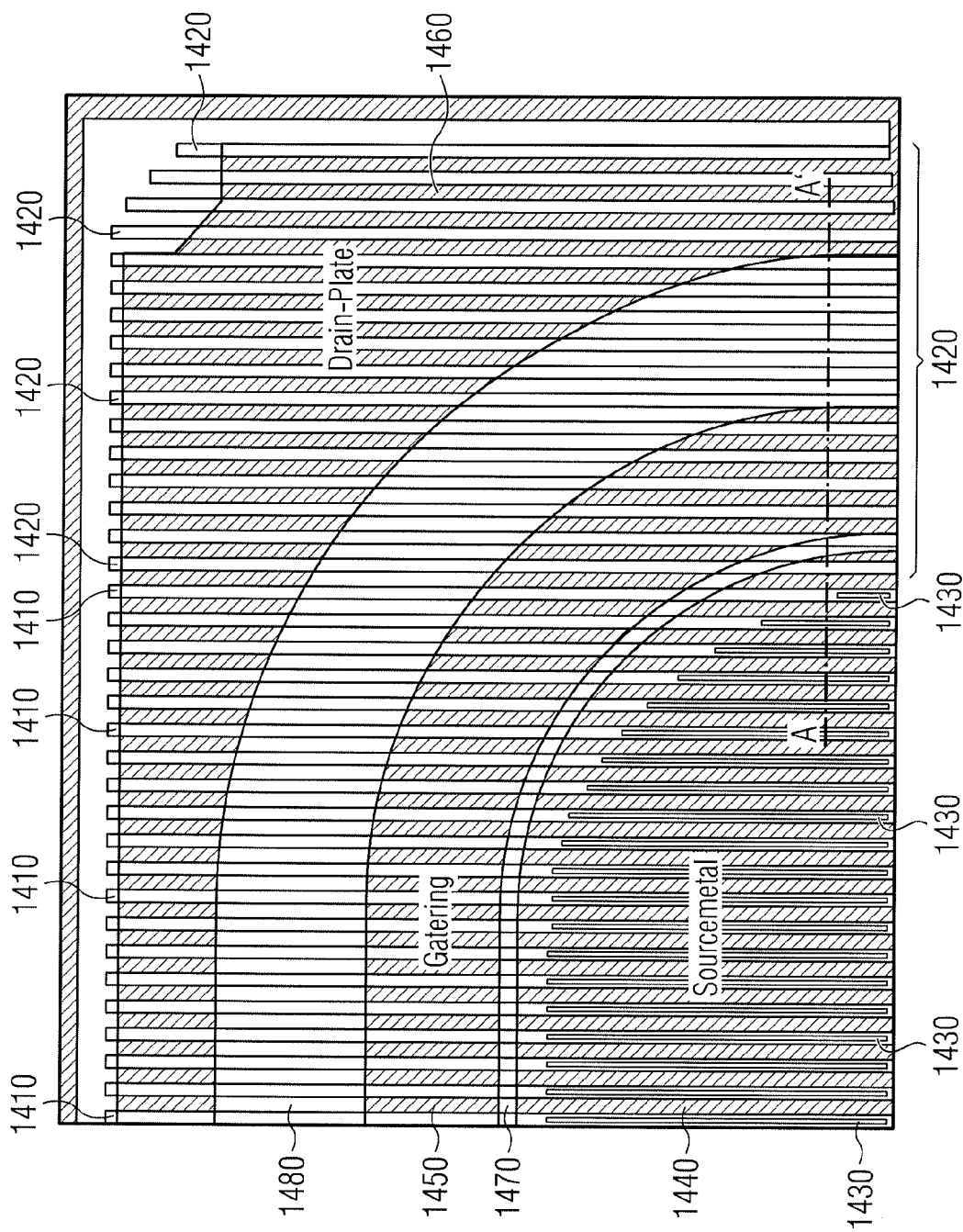
FIG. 14 shows a schematic top view of an edge region of the semiconductor device.

FIG. 14 shows a chip section of a stripe layout showing contact hole stripes 1430. The corner section of the semiconductor device shown in FIG. 14 illustrates a plurality of stripe shaped cell compensation regions 1410 (e.g. p-pillars) and a plurality of stripe-shaped edge compensation regions 1420 (e.g. "floating" p-pillars). The plurality of stripe-shaped cell compensation regions 1410 are connected to a source metal 1440 covering the cell region through the contact hole stripes 1430. The gates of the field-effect transistor structures within the cell region are connected to a gate ring 1450 located between the source metal 1440 and a drain plate 1460 extending along the chip edges. A first metal-free area 1470 is located between the source metal 1440 and the gate ring 1450 and a second metal-free area 1480 is located between the gate ring 1450 and the drain plate 1460. The plurality of stripe shaped edge compensation regions (p-stripes) 1420 are not directly connected to the contact holes 1430 resulting in floating p-pillars, if no proposed bridge structures are implemented. The plurality of stripe-shaped edge compensation regions 1420 may be connected to at least one of the plurality of stripe-shaped cell compensation regions 1410 through one or more bridge structures (not shown in FIGS. 14 and 15) located outside the cell region.

More details and aspects are mentioned in connection with the embodiments described above or below. The embodiment shown in FIG. 14 may comprise one or more optional additional features corresponding to one or more aspects mentioned in connection with the proposed concept or one or more embodiments described above (e.g. FIG. 1-13) or below (e.g. FIG. 15-17).

Figure 15:
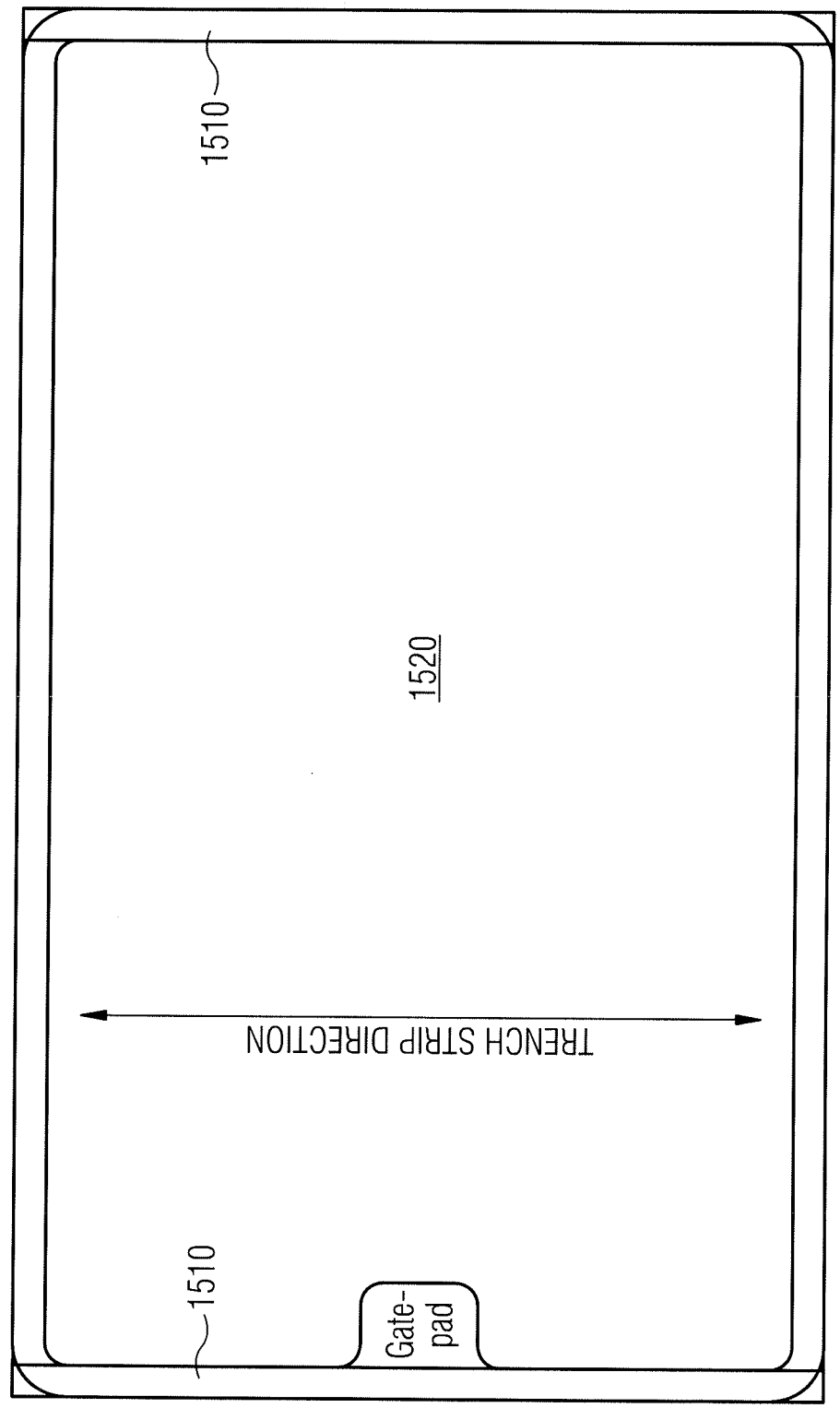
FIG. 15 shows a schematic top view of the semiconductor device of FIG. 14.

FIG. 15 shows an example for floating area portions by a chip top view of a chip of medium size (without proposed bridge structure), for example. The floating areas 1510 indicate areas which may lead to a first order floating effect. The first order floating effect may be reduced or avoided by implementing bridge structures within the edge termination region. In the example of FIG. 15, the floating areas 1510 are located at two opposite sides of the cell field area 1520. Further a gate path may be located between the cell field area and the edge termination region comprising the floating areas.

According to an aspect, the p-stripes at the chip edge (which may be otherwise floating) can be connected to the contact holes or more precisely to p-stripes connected to contact holes through low-ohmic bridges.

Additionally, the bridge may connect locations, which may be already at equal or similar potential. For example, each low-ohmic bridge may be designed substantially equidistant or equally-spaced to an edge of a potential plate at the surface (e.g. the gate metal ring or drain metal plate). In this way, edge breakthroughs may be reduced or avoided, which may occur otherwise since the different stripes may be at different potentials and their low-ohmic connections may be an equipotential surface on the other hand.

Additionally, the bridges may be connected to the p-stripes as far outside at the chip edge as possible. For example, the ends of the p-stripes may be connected to each other by the low-ohmic bridges. For example, the p-stripes may end within the drain region (e.g. a voltage of some volt below the drain voltage may occur in the drain region, for example the drain voltage reduced by the pillar depletion voltage) apart from special edge constructions (e.g. undoped or partly doped edge) so that also the bridges are at drain potential or close to drain potential. Extremely high p- and n-charge amounts may be immediately neighboring each other in the drain region due to the implementation of the bridges. However, the field arising due to the depletion may be low and edge breakthroughs at these positions may be avoided, since the voltage difference between these regions may be low (e.g. in the range of the pillar depletion voltage).

Therefore, problems with massive or even infinite charge sources represented by the low-ohmic layer (e.g. in case of a conductor) may be avoided. Otherwise, the compensation within the closest surrounding may be reduced or destroyed, which may lead to an early breakthrough.

The compensation requirements may be kept with reduced compensation degree, if the bridges are implemented by high-ohmic or lightly doped p-regions instead of low-ohmic (which may be depleted and may pick up voltage and consequently representing no equipotential surfaces), for example.

A corresponding layout is shown in FIG. 3 (chip section shows a chip corner) and a schematic cross-section (cut through line A-A') as shown in FIG. 2. FIG. 3 shows a chip corner with additional low-ohmic bridge between the p-stripes in the drain region. FIG. 2 shows a schematic simplified cross-section of the cut line A-A'.

Figure 16:
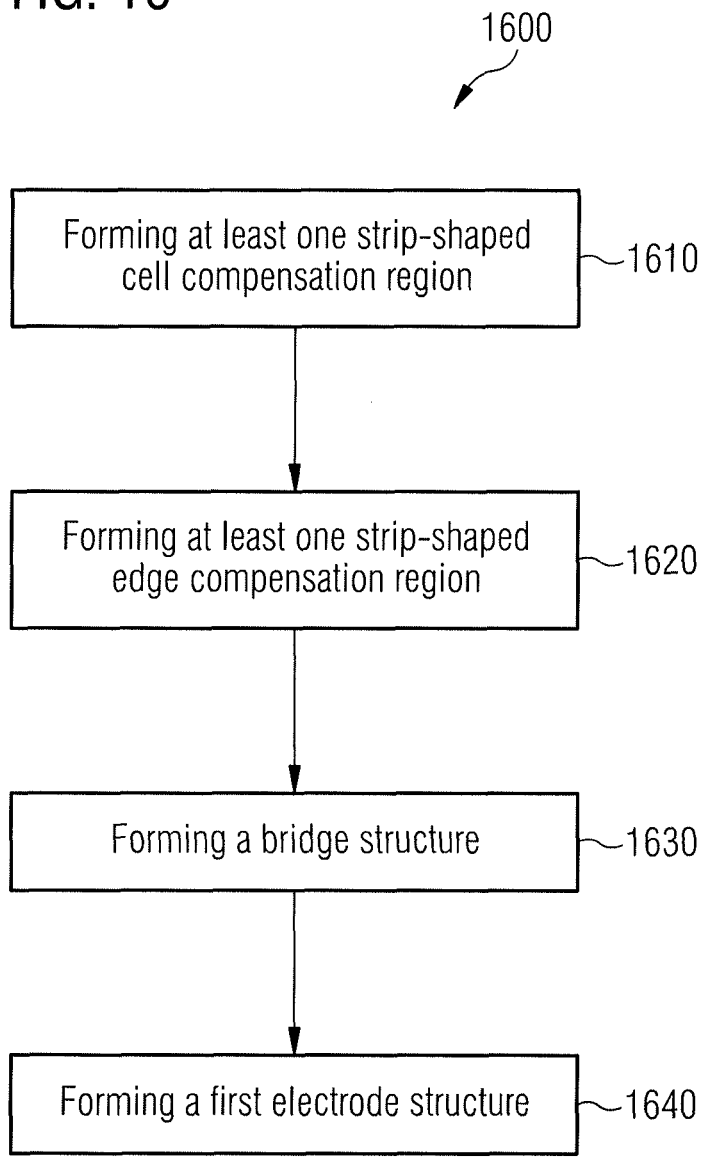
FIG. 16 shows a flowchart of a method for forming a semiconductor device.

FIG. 16 shows a flowchart of a method 1600 for forming a semiconductor device according to an embodiment. The method 1600 comprises forming 1610 at least one stripe-shaped cell compensation region of a vertical electrical element arrangement. The at least one stripe-shaped cell compensation region extends into a semiconductor substrate and comprises a first conductivity type. The stripe-shaped cell compensation region is connected to a first electrode structure of the vertical electrical element arrangement. Further, the first electrode structure is in contact with the semiconductor substrate within the cell region of the semiconductor device only. Additionally, the method 1600 comprises forming 1620 at least one stripe-shaped edge compensation region extending into the semiconductor substrate within an edge termination region of the semiconductor device and outside the cell region. The at least one stripe-shaped edge compensation region comprises the first conductivity type. Further, the method 1600 comprises forming 1630 a bridge structure electrically connecting the at least one stripe-shaped edge compensation region with the at least one stripe-shaped cell compensation region within the edge termination region. Additionally, the method 1600 comprises forming 1640 the first electrode structure.

Free charge carriers may be removed from the at least one stripe-shaped edge compensation region during the switch-off of the vertical electrical element arrangement through the bridge structure and the at least one stripe-shaped cell compensation region to the first electrode structure by forming the bridge structure. In this way, a low-ohmic path may be provided for the depletion of charge carriers within the stripe-shaped cell compensation region during switch-off. In this way, switching losses may be reduced and/or the breakthrough behavior of the semiconductor device may be improved.

More details and aspects are mentioned in connection with the embodiments described above or below. The embodiment shown in FIG. 16 may comprise one or more optional additional features corresponding to one or more aspects mentioned in connection with the proposed concept or one or more embodiments described above (e.g. FIGS. 1-15) or below.

Figure 17:
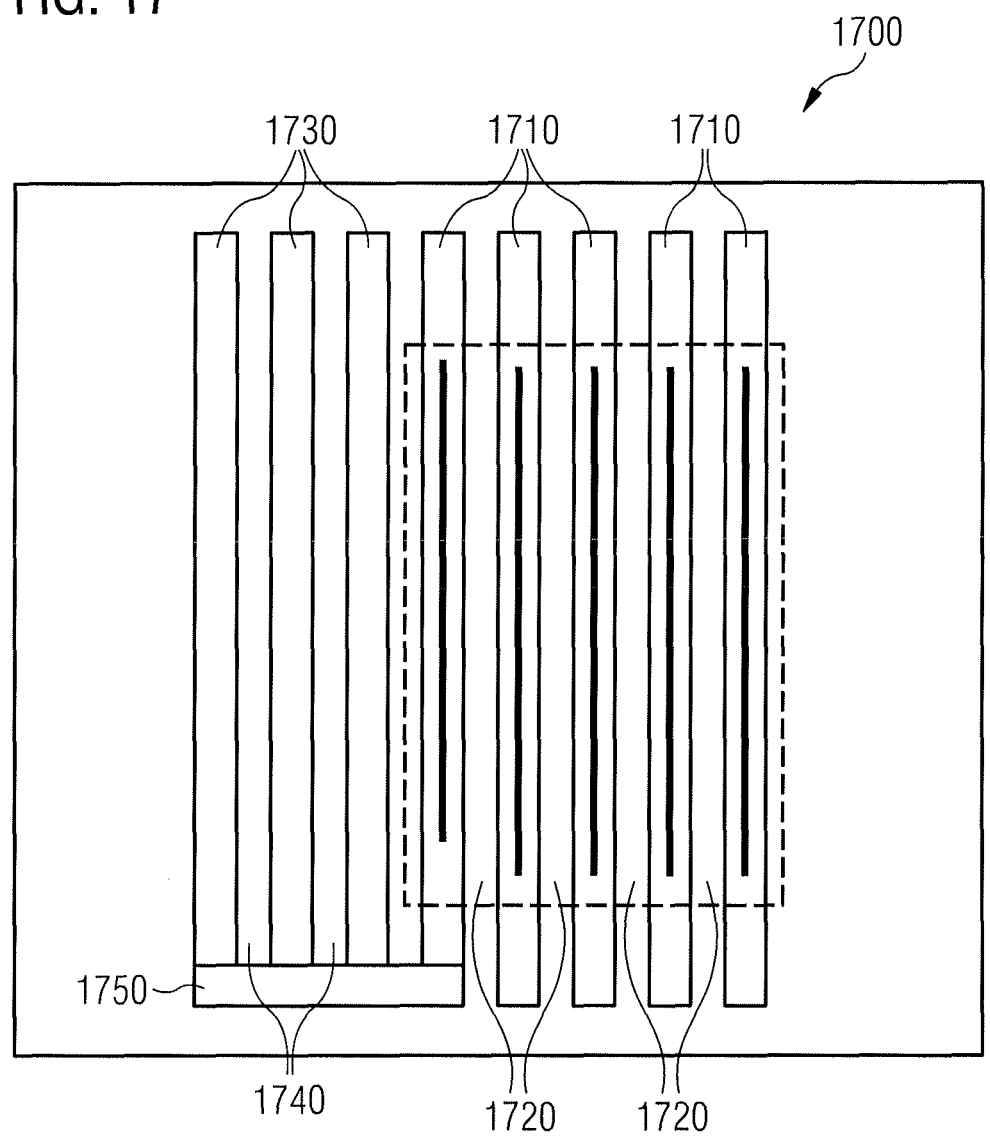
FIG. 17 shows a schematic top view of a semiconductor device.

FIG. 17 shows a semiconductor device 1700 according to an embodiment. The semiconductor device 1700 comprises a plurality of strip-shaped cell compensation regions 1710 of a vertical electrical element arrangement of a first conductivity type arranged adjacent to a plurality of strip-shaped drift regions 1720 of the vertical electrical element arrangement of a second conductivity type. Further, the semiconductor device 1700 comprises a plurality of strip-shaped edge compensation regions 1730 of the first conductivity type arranged adjacent to inactive strip-shaped regions 1740 of the second conductivity type. Additionally, the semiconductor device 1700 comprises a bridge structure 1750 electrically connecting the plurality of strip-shaped edge compensation regions 1730 with at least one strip-shaped cell compensation region 1710 of the plurality of strip-shaped cell compensation regions 1710.

Free charge carriers may be removed from the at least one stripe-shaped edge compensation region during the switch-off of the vertical electrical element arrangement through the bridge structure and the at least one stripe-shaped cell compensation region to a source electrode structure by implementing the bridge structure. In this way, a low-ohmic path may be provided for the depletion of charge carriers within the stripe-shaped cell compensation region during switch-off. In this way, switching losses may be reduced and/or the breakthrough behavior of the semiconductor device may be improved.

For example, the vertical electrical element arrangement may be a field effect transistor arrangement. For example, the plurality of strip-shaped drift regions 1720 of the field effect transistor arrangement extend into the semiconductor substrate within a cell region of the semiconductor device 1700. The plurality of strip-shaped drift regions 1720 and the plurality of strip-shaped cell compensation regions 1710 may be arranged alternatingly. The plurality of strip-shaped drift regions 1720 may carry the whole (or more than 90% or more than 99% of the current) current flowing through the vertical field effect transistor arrangement in an on-state of the vertical field effect transistor arrangement. In contrast, the inactive strip-shaped regions 1740 might not contribute to the current flowing through the vertical field effect transistor arrangement in an on-state of the vertical field effect transistor arrangement.

The plurality of strip-shaped drift regions 1720 and/or the inactive strip-shaped regions 1740 may comprise equal or similar shape and/or geometry. A lateral length and/or a lateral width and/or a vertical depth of the plurality of strip-shaped drift regions 1720 and/or the inactive strip-shaped regions 1740 may be equal or similar to a lateral length and/or a lateral width and/or a vertical depth of the plurality of strip-shaped cell compensation regions 1710 and/or the plurality of strip-shaped edge compensation regions 1730 (e.g. described in connection with FIG. 1).

More details and aspects are mentioned in connection with the embodiments described above (e.g. FIG. 1) or below. The embodiment shown in FIG. 17 may comprise one or more optional additional features corresponding to one or more aspects mentioned in connection with the proposed concept or one or more embodiments described above (e.g. FIGS. 1-16) or below.

Some embodiments relate to a power semiconductor device. In other words, a semiconductor device according to the described concept or one or more embodiments described above or below may comprise a blocking voltage of more than 100 V (e.g. between 100 V and 10000 V or more than 200 V, more than 500 V or more than 1000 V).

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
   a strip-shaped cell compensation region of a vertical electrical element arrangement, wherein the at least one strip-shaped cell compensation regions extends into a semiconductor substrate and comprises a first conductivity type,
   wherein the at least one strip-shaped cell compensation region is connected to a first electrode structure of the vertical electrical element arrangement;
   at least one strip-shaped edge compensation region extending into the semiconductor substrate within an edge termination region of the semiconductor device outside the cell region, wherein the at least one strip-shaped edge compensation region comprises the first conductivity type; and
   a bridge structure electrically connecting the at least one strip-shaped edge compensation region with the at least one strip-shaped cell compensation region within the edge termination region;
   wherein the bridge structure comprises a highly-doped doping region of the first conductivity type electrically connecting the at least one strip-shaped edge compensation region with the at least one strip-shaped cell compensation region, wherein a doping concentration of the highly-doped doping region is larger than a doping concentration of the at least one strip-shaped cell compensation region.

2. The semiconductor device according to claim 1, wherein a doping concentration of the highly-doped doping region of the bridge structure is larger than $1*10^{17}$ cm$^{-3}$.

3. The semiconductor device according to claim 1, wherein the bridge structure comprises a conductive material structure above the semiconductor substrate being in contact with the at least one strip-shaped edge compensation region and the at least one strip-shaped cell compensation region within the edge termination region.

4. The semiconductor device according to claim 1, comprising a second electrode structure arranged within the edge termination region, wherein the bridge structure is located below a field plate of the second electrode structure or is located closer to an edge of the field plate of the second electrode structure than to an edge of the cell region, wherein the second electrode structure is electrically connected to a back side electrode structure.

5. The semiconductor device according to claim 4, wherein the bridge structure extends substantially in parallel to an edge of the second electrode plate of the second electrode structure.

6. The semiconductor device according to claim 1, wherein the at least one strip-shaped cell compensation region connected to the bridge structure comprises a first part being located in the cell region and being in contact with the first electrode structure and a second part being located in the edge termination region and being in contact with the bridge structure.

7. The semiconductor device according to claim 1, wherein the bridge structure is connected to the at least one strip-shaped cell compensation region at an end portion of the at least one strip-shaped cell compensation region, wherein the end portion of the at least one strip-shaped cell compensation region is represented by the last 10% of length of the at least one strip-shaped cell compensation region.

8. The semiconductor device according to claim 1, wherein a distance between the first electrode structure and a contact area between the bridge structure and the at least one strip-shaped cell compensation region is larger than 50 µm.

9. The semiconductor device according to claim 1, wherein the bridge structure is configured to electrically connect the at least one strip-shaped edge compensation region with the at least one strip-shaped cell compensation region so that a number of free charge carriers within the at least one strip-shaped edge compensation region is reduced by a current through the bridge structure and the at least one strip-shaped cell compensation region to the first electrode structure during switching the vertical electrical element arrangement from an on-state to an off-state.

10. The semiconductor device according to claim 1, comprising a plurality of strip-shaped cell compensation regions, wherein the plurality of strip-shaped cell compensation regions and a plurality of strip-shaped edge compensation regions are arranged substantially in parallel to an edge of the semiconductor substrate, wherein a bridge structure electrically connecting at least one strip-shaped edge compensation region of the plurality of strip-shaped edge compensation regions with at least one strip-shaped cell compensation region of the plurality of strip-shaped cell compensation regions is arranged within the edge termination region at each corner of the semiconductor substrate.

11. The semiconductor device according to claim 1, comprising a plurality of strip-shaped cell compensation regions, wherein the plurality of strip-shaped cell compensation regions and a plurality of strip-shaped edge compensation regions are arranged substantially in parallel to a common strip direction, wherein an angle between the common strip direction and an edge of the semiconductor substrate is between 20° and 70°, wherein a bridge structure electrically connecting at least one strip-shaped edge compensation region of the plurality of strip-shaped edge compensation regions with at least one strip-shaped cell compensation region of the plurality of strip-shaped cell compensation regions is arranged within two edge termination regions at opposite corners of the semiconductor substrate.

12. The semiconductor device according to claim 1, comprising a plurality of strip-shaped cell compensation regions, wherein a strip-shaped cell compensation region of the plurality of strip-shaped cell compensation regions comprises a laterally summed number of dopants per unit area of the first conductivity type deviating from half of a laterally summed number of dopants per unit area of the second conductivity type comprised by two strip-shaped drift regions located adjacent to opposite sides of the strip-shaped cell compensation region by less than +/−25% of the laterally summed number of dopants per unit area of the first conductivity type comprised by the strip-shaped cell compensation region.

13. The semiconductor device according to claim 1, comprising a plurality of strip-shaped cell compensation regions, wherein the plurality of strip-shaped cell compensation regions extend from a front side surface of the semiconductor substrate into a depth of more than 10 µm.

14. The semiconductor device according to claim 1, wherein the vertical electrical element arrangement is a field effect transistor arrangement and the first electrode structure is a source electrode structure of the field effect transistor arrangement.

15. The semiconductor device according to claim 1, comprising a plurality of strip-shaped drift regions of the vertical electrical element arrangement extending into the semiconductor substrate within the cell region of the semiconductor device, wherein the plurality of strip-shaped drift regions comprise a second conductivity type, wherein the plurality of strip-shaped drift regions and a plurality of strip-shaped cell compensation regions are arranged alternatingly.

16. The semiconductor device according to claim 1, wherein the edge termination region laterally surrounds the cell region.

17. The semiconductor device according to claim 1, wherein the first electrode structure is in contact with the semiconductor substrate within a cell region of the semiconductor device only.

18. A semiconductor device comprising:
a strip-shaped cell compensation region of a vertical electrical element arrangement, wherein the at least one strip-shaped cell compensation regions extends into a semiconductor substrate and comprises a first conductivity type,
wherein the at least one strip-shaped cell compensation region is connected to a first electrode structure of the vertical electrical element arrangement;
at least one strip-shaped edge compensation region extending into the semiconductor substrate within an edge termination region of the semiconductor device outside the cell region, wherein the at least one strip-shaped edge compensation region comprises the first conductivity type;
a bridge structure electrically connecting the at least one strip-shaped edge compensation region with the at least one strip-shaped cell compensation region within the edge termination region;
a plurality of strip-shaped drift regions of the vertical electrical element arrangement extending into the semiconductor substrate within the cell region of the semiconductor device, wherein the plurality of strip-shaped drift regions comprise a second conductivity type, wherein the plurality of strip-shaped drift regions and a plurality of strip-shaped cell compensation regions are arranged alternatingly; and
a drain or emitter region within the semiconductor substrate arranged vertically between the at least one strip-shaped cell compensation regions and a back side electrode arranged at a backside surface of the semiconductor substrate, wherein the drain or emitter region comprises the second conductivity type.

19. A semiconductor device comprising:
a plurality of strip-shaped cell compensation regions of a vertical electrical element arrangement of a first conductivity type arranged adjacent to a plurality of strip-shaped drift regions of the vertical electrical element arrangement of a second conductivity type;
a plurality of strip-shaped edge compensation regions of the first conductivity type arranged adjacent to inactive strip-shaped regions of the second conductivity type; and
a bridge structure electrically connecting the plurality of strip-shaped edge compensation regions with at least one strip-shaped cell compensation region of the plurality of strip-shaped cell compensation regions;
wherein the bridge structure comprises a highly-doped doping region of the first conductivity type electrically connecting the at least one strip-shaped edge compensation region with the at least one strip-shaped cell compensation region, wherein a doping concentration of the highly-doped doping region is larger than a doping concentration of the at least one strip-shaped cell compensation region.

\* \* \* \* \*